(12) United States Patent
Liaw

(10) Patent No.: US 9,640,540 B1
(45) Date of Patent: May 2, 2017

(54) STRUCTURE AND METHOD FOR AN SRAM CIRCUIT

(71) Applicant: Taiwan Semiconductor Manufacturing Co., Ltd., Hsin-Chu (TW)

(72) Inventor: Jhon Jhy Liaw, Hsinchu County (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 15/213,542

(22) Filed: Jul. 19, 2016

(51) Int. Cl.
*H01L 27/11* (2006.01)
*G11C 11/419* (2006.01)
*H01L 29/78* (2006.01)
*H01L 21/8238* (2006.01)

(52) U.S. Cl.
CPC ........ *H01L 27/1104* (2013.01); *G11C 11/419* (2013.01); *H01L 21/823842* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 7,502,273 B2 | 3/2009 | Liaw | |
| 7,667,271 B2 | 2/2010 | Yu et al. | |
| 7,910,453 B2 | 3/2011 | Xu et al. | |
| 8,144,540 B2 | 3/2012 | Liaw | |
| 8,362,575 B2 | 1/2013 | Kwok et al. | |
| 8,367,498 B2 | 2/2013 | Chang et al. | |
| 8,377,779 B1 | 2/2013 | Wang | |
| 8,399,931 B2 | 3/2013 | Liaw et al. | |
| 8,440,517 B2 | 5/2013 | Lin et al. | |
| 8,497,528 B2 | 7/2013 | Lee et al. | |
| 8,605,523 B2 | 12/2013 | Tao et al. | |
| 8,610,240 B2 | 12/2013 | Lee et al. | |
| 8,630,132 B2 | 1/2014 | Cheng et al. | |

(Continued)

OTHER PUBLICATIONS

L. P. B. Lima, H. F. W. Dekkers, J. G. Lisoni, J.A. Diniz, S. Van Elshocht, and S. De Gendt, "Metal gate work function tuning by Al incorporation in TiN," Journal of Applied Physics115, 2014, pp. 074504-1 through 074504-5, American Institute of Physics.

*Primary Examiner* — James G Norman
(74) *Attorney, Agent, or Firm* — Haynes and Boone, LLP

(57) ABSTRACT

An integrated circuit includes first and second SRAM cells. The first SRAM cell includes first and second pull-up devices, first and second pull-down devices configured with the first and second pull-up devices to form first and second cross-coupled inverters, first and second pass-gate devices configured with the first and second cross-coupled inverters for writing data, a read pull-down device coupled to the first inverter, and a read pass-gate device coupled to the read pull-down device. The second SRAM cell includes third and fourth pull-up devices, and third and fourth pull-down devices configured with the third and fourth pull-up devices to form third and fourth cross-coupled inverters. Work function layers of gates of the first pull-up device, first pull-down device, and third pull-up device have a first work function, a second work function, and a third work function respectively. The first, second, and third work functions are different from each other.

20 Claims, 21 Drawing Sheets

(56) References Cited

U.S. PATENT DOCUMENTS

| | | | |
|---|---|---|---|
| 8,652,894 B2 | 2/2014 | Lin et al. |
| 8,680,576 B2 | 3/2014 | Ching et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,735,993 B2 | 5/2014 | Lo et al. |
| 8,736,056 B2 | 5/2014 | Lee et al. |
| 8,760,948 B2 | 6/2014 | Tao et al. |
| 8,772,109 B2 | 7/2014 | Colinge |
| 8,785,285 B2 | 7/2014 | Tsai et al. |
| 8,796,759 B2 | 8/2014 | Perng et al. |
| 8,809,139 B2 | 8/2014 | Huang et al. |
| 8,816,444 B2 | 8/2014 | Wann et al. |
| 8,823,065 B2 | 9/2014 | Wang et al. |
| 8,828,823 B2 | 9/2014 | Liu et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,860,148 B2 | 10/2014 | Hu et al. |
| 8,942,030 B2 | 1/2015 | Liaw |
| 8,964,455 B2 | 2/2015 | Liaw |
| 2009/0108372 A1* | 4/2009 | Chen ............... H01L 27/1104 257/392 |
| 2011/0068407 A1 | 3/2011 | Yeh et al. |
| 2013/0011983 A1 | 1/2013 | Tsai et al. |
| 2014/0001574 A1 | 1/2014 | Chen et al. |
| 2014/0032871 A1 | 1/2014 | Hsu et al. |
| 2014/0110755 A1 | 4/2014 | Colinge |
| 2014/0151812 A1 | 6/2014 | Liaw |
| 2014/0153321 A1 | 6/2014 | Liaw |
| 2014/0153345 A1 | 6/2014 | Kim et al. |
| 2014/0177352 A1 | 6/2014 | Lum |
| 2014/0233330 A1 | 8/2014 | Ko et al. |
| 2014/0241077 A1 | 8/2014 | Katoch et al. |
| 2014/0252412 A1 | 9/2014 | Tsai et al. |
| 2014/0269114 A1 | 9/2014 | Yang et al. |
| 2016/0190305 A1 | 6/2016 | JangJian et al. |

* cited by examiner

US 9,640,540 B1

STRUCTURE AND METHOD FOR AN SRAM CIRCUIT

BACKGROUND

In deep sub-micron integrated circuit technology, an embedded static random access memory (SRAM) device has become a popular storage unit of high speed communication, image processing and system-on-chip (SOC) products. For example, a fin transistor, such as a fin field-effect transistor (FinFET), is introduced to replace a planar transistor and is used to form a SRAM device. The fin transistor has a channel (referred to as a fin channel) associated with a top surface and opposite sidewalls. The fin channel has a total channel width defined by the top surface and the opposite sidewalls. In advanced technology nodes, such as 20 nm or beyond, a FinFET is advantageous to the planar transistor because of its lower leakage.

However, SRAM devices formed by FinFETs face the increasing demanding requirement of reducing power consumption and increasing speed. For example, in SOC applications, to reduce power consumption, when in a sleep mode or a low-power mode, the operation voltage of logic circuits can be reduced or turned off to save power. However, in such SOC applications, the processor (e.g., a central computing unit (CPU), a mobile accelerated processing unit (APU)) may remain operating in the sleep mode and need to access level-1 (L1) cache memories (e.g., an L1 data cache memory, an L1 instruction cache memory). Thus, the operation voltage of SRAM devices used in the L1 cache SRAM devices may affect the operation voltage of the processor and the overall power consumption. However, reduction in the operation voltage of the SRAM devices may result in an SRAM cell stability concern. Furthermore, tuning threshold voltages of FinFETs of the SRAM cells may be challenging. The thinner channel region of the FinFET leads to less channel dopant sensitivity, which limits the threshold voltage tuning range. While higher threshold voltages may be achieved by doping the channel region of the FinFET heavily, such heavy doping may dramatically degrade the threshold voltage mismatch performance between pair transistors in an SRAM cell, increase the leakage, and lead to worse device variation as well as failures in low voltage operations.

Therefore, it is desired to have a new structure and a method to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
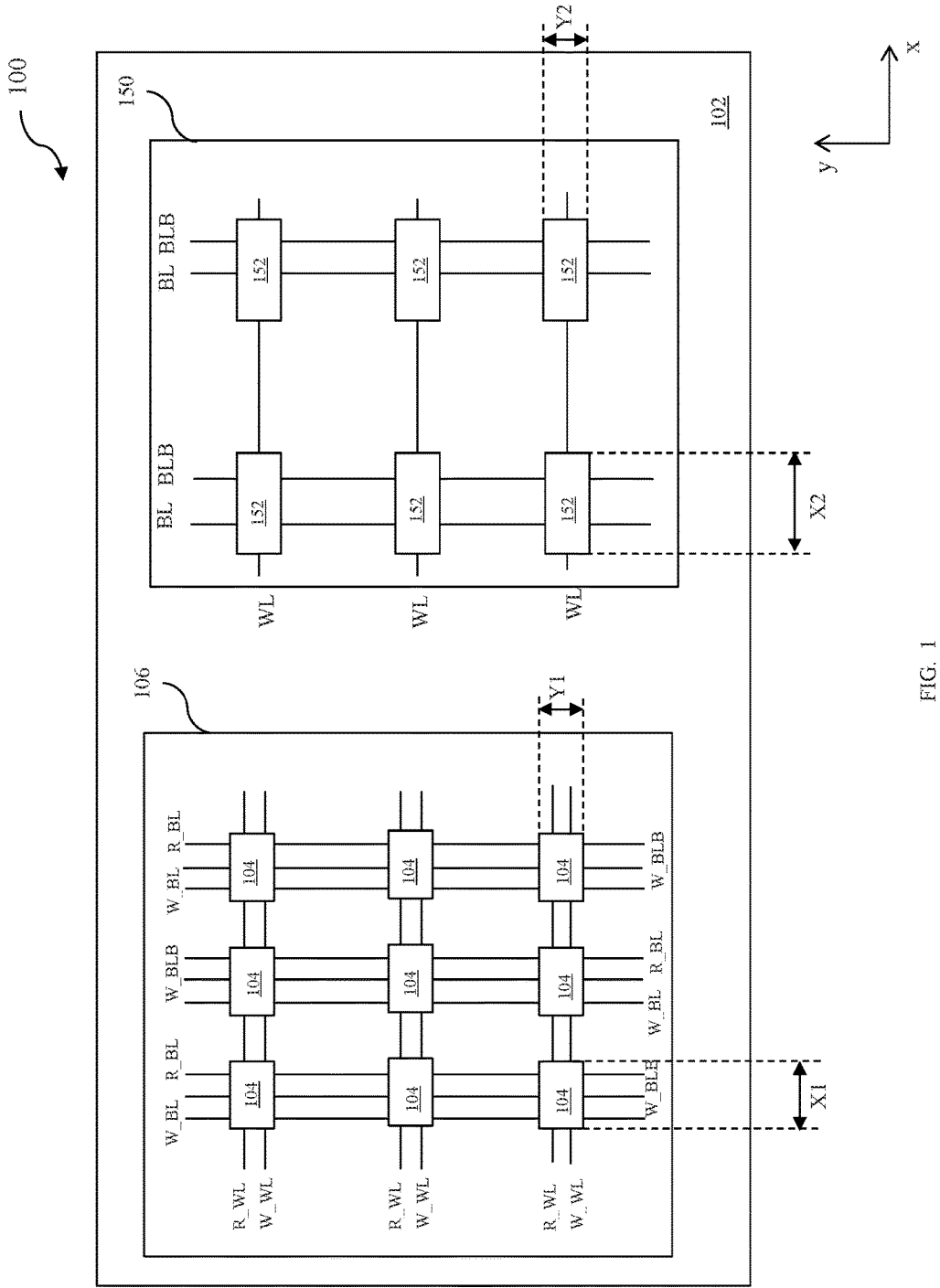
FIG. 1 is a schematic view of an embodiment of an integrated circuit according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is an example of an integrated circuit 100 including a single-port SRAM cell array and a two-port SRAM cell array for proper data accessing. The integrated circuit 100 is formed on a substrate 102. The substrate 102 is a semiconductor substrate. In some examples, the substrate 102 includes silicon. In some embodiments, the substrate includes germanium, silicon germanium or other proper semiconductor materials. The substrate 102 also includes various isolation features such as shallow trench isolation (STI) formed in the substrate to separate various devices. The substrate 102 also includes various doped regions such as n-well and p-wells.

In some embodiments, the integrated circuit 100 includes a plurality of two-port SRAM cells 104 (also referred to as two-port cells 104) configured in a two-port SRAM array 106 having rows and columns for proper data accessing. Each two-port cell 104 includes a write port configured for write operations and a read port configured for read operations. The write port is connected to a write word line W_WL, a write bit-line W_BL, and a write complementary bit-line W_BLB. The read port of the two-port cell 104 is connected to a read word line R_WL and a read bit-line R_BL. Each row of the two-port cells 104 is connected to a write word line W_WL and a read word line R_WL. Each column of the two-port cells 104 is connected to a write bit-line W_BL, a write complementary bit-line W_BLB, and a read bit-line R_BL. In some examples, each two-port cell 104 has rectangular cell shape, and has a cell size with a width X1 in the x direction and a height Y1 in the y direction. The width X1 is also referred to as an X-pitch X1 of the two-port cell 104. The height Y1 is also referred to as a Y-pitch Y1 of the two-port cell 104. In some examples, a ratio of X1:Y1 is greater than about two. The two-port cell 104 will be described in detail below with reference to FIG. 2A.

In some embodiments, the two-port SRAM array 106 does not adopt column multiplexers (MUX), and hence no dummy read occurs during write/read operations. Such design may further lower the operation voltage Vcc_min and data retention voltage.

In some embodiments, the integrated circuit 100 includes a plurality of single-port SRAM cells 152 (also referred to as single-port cells 152) configured in a single-port SRAM array 150 including rows and columns for proper data accessing. Each single-port cell 152 includes a port configured for both read and write operations. The port is connected to a word line WL and a bit-line BL. In some examples, the port is further connected to a complementary bit-line BLB. Each row of the single-port cells 152 is connected to a word line WL. Each column of the single-port cells 152 is connected to a bit-line BL and/or a complementary bit-line BLB. In some examples, each single-port cell 152 has a cell size with a width X2 in the x direction and a height Y2 in the y direction. The width X2 is also referred to as an X-pitch X2 of the single-port cell 152. The height Y2 is also referred to as a Y-pitch Y2 of the single-port cell 152. In some embodiments, the width X2 is greater than the width X1. In an example, a ratio of X2:X1 is greater than about 1.35. In some embodiments, the heights Y1 and Y2 are substantially the same. The single-port cell 152 will be described in detail below with reference to FIG. 2B.

Figure 2A:
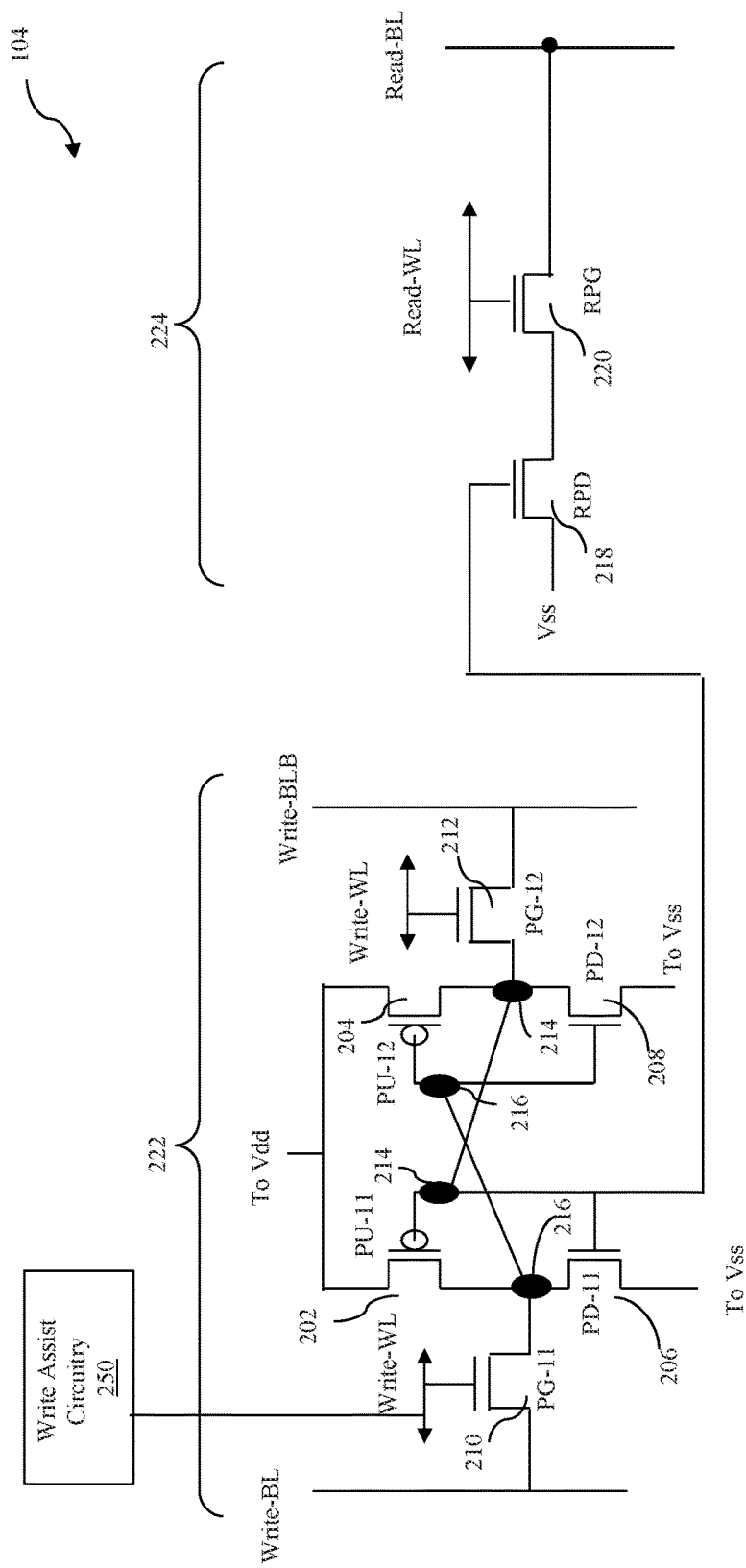
FIG. 2A is a schematic view of an embodiment of a two-port SRAM cell according to various aspects of the present disclosure.

Referring to FIG. 2A, illustrated therein is an example of a two-port cell 104. The two-port cell 104 includes a write port portion 222 and a read port portion 224. The write portion 222 includes p-type fin field-effect transistors (FinFETs) 202 and 204, and n-type FinFETs 206, 208, 210, and 212. The write portion 222 includes a first inverter and a second inverter that are cross-coupled as a data storage. In some embodiments, the first inverter includes a pull-up device 202, referred to as PU-11. The first inverter further includes a pull-down device 206, referred to as PD-11. The drains of the PU-11 and PD-11 are electrically connected together, forming a storage node 216. The gates of PU-11 and PD-11 are electrically connected together. The source of PU-11 is electrically connected to a power line Vdd. The source of PD-11 is electrically connected to a complimentary power line Vss.

In some embodiments, the second inverter includes a pull-up device 204, referred to as PU-12. The second inverter also includes a pull-down device 208, referred to as PD-12. The drains of the PU-12 and PD-12 are electrically connected together, forming a storage node 214 (also referred to as a storage node bar 214). The gates of PU-12 and PD-12 are electrically connected together. The source of PU-12 is electrically connected to the power line Vdd. The source of PD-12 is electrically connected to the complimentary power line Vss. Furthermore, the storage node 216 is electrically connected to the gates of PU-12 and PD-12, and the storage node 214 is electrically connected to the gates of PU-11 and PD-11. Therefore, the first and second inverters are cross-coupled as illustrated in FIG. 2A.

In some embodiments, the write portion 222 further includes a pass-gate device 210 formed with an n-type fin field-effect transistor (nFinFET), referred to as PG-11, and a pass-gate device 212 formed with an n-type fin field-effect transistor (nFinFET), referred to as PG-12. The source of the pass-gate device PG-11 is electrically connected to the storage node 216, and the source of the pass-gate device PG-12 is electrically connected to the storage node 214, forming a write port for data access. Furthermore, the drain of PG-11 is electrically connected to a write bit-line (Write-BL), and the gate of PG-11 is electrically connected to a write word line (Write-WL). Similarly, the drain of PG-12 is electrically connected to a complementary write bit-line (also referred to as write bit-line bar (Write-BLB)), and the gate of PG-12 is electrically connected to the write word line (Write-WL).

In some embodiments, the read port portion 224 of the two-port cell 104 includes nFinFETs 218 and 220. The nFinFET 218 is also referred to as a read pull-down device (RPD) 218, and the nFinFET 220 is also referred to as a read pass-gate device (RPG) 220. The RPD 218 and RPG 220 are serially coupled between a complementary supply voltage, such as ground or Vss, and a read BL. In the example of FIG. 2A, the RPD 218 has a source coupled to the complementary supply voltage Vss, and a drain coupled to a drain of the RPG 220. The source of the RPG 220 is coupled to a read bit-line (Read-BL), and its gate is controlled by a read word line (Read-WL).

In some embodiments, in a write operation, the voltage on the write word line is raised above a predetermined level to turn on the PG-11 and PG-12. During the write operation, the voltage of the read word line is below a predetermined level, and the RPG 220 is turned off. In some examples, the write bit-line is pulled high, and the complementary write bit-line is pulled low, or vice versa, in order to write logic "1" or "0" to the two-port cell 104.

In some embodiments, in a read operation, the voltage on the read word line is raised to a predetermined level to turn on the RPG 220. During the read operation, the voltage on the write word line is below a predetermined level and the PG-11 and PG-12 are turned off. The sensing current on the read bit-line is then detected by a sense amplifier to determine the logic state of the two-port cell 104.

In some embodiments, the integrated circuit 100 includes a write assist circuitry 250 coupled with the two-port cell 104. The write-assist circuitry 250 includes word-line voltage boost generators electrically connected to the write word line, and is designed to be operable to dynamically provide a higher write word line voltage in the two-port cell 104 during a write operation. Particularly, during an SRAM write operation, a voltage applied to the write word line is controlled to be greater than the nominal operation voltage Vdd (e.g., by a voltage between about 30 millivolts (mV) and 300 mV). By controlling the write word-line voltage during the write operations, the write-assist circuitry 250 improves the write port write capability, and helps to achieve a lower operation voltage Vcc_min for write operations, where Vcc_min is the lowest operation voltage. Such Vcc_min may be used in operation conditions having a lower speed and lower active power. In some embodiments, the voltage gap between Vdd and Vcc_min is within a range of about 10% to about 50% of Vdd. Any circuit known in the art with above functionality may be used and be included in the integrated circuit 100.

In various embodiments, the two-port cell 104 may include additional devices such as additional pull-down devices and pass-gate devices. In some examples, each of the first and second inverters includes one or more pull-down devices configured in parallel.

Figure 2B:
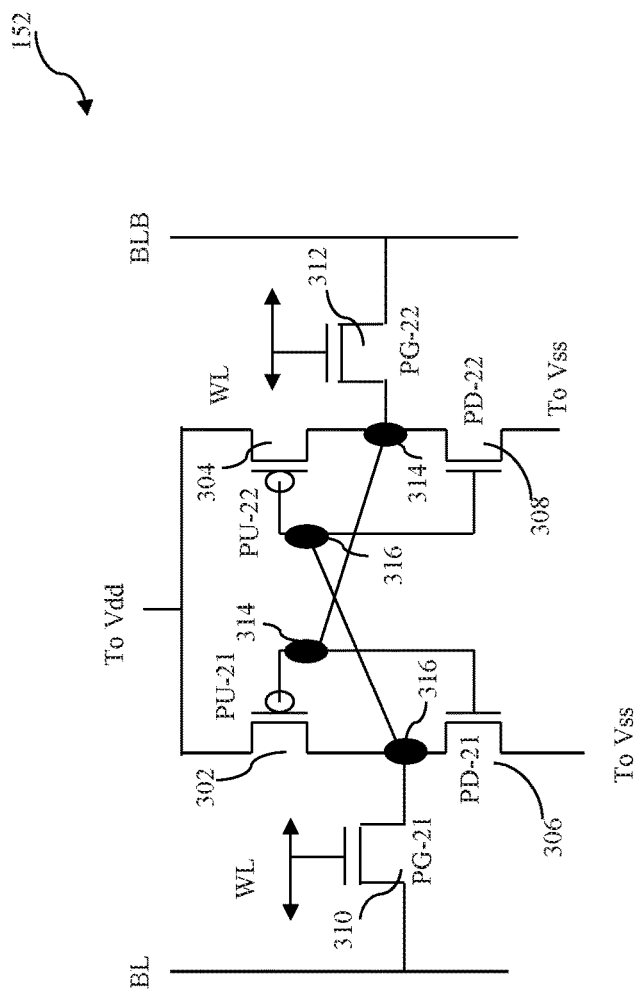
FIG. 2B is a schematic view of an embodiment of a single-port SRAM cell according to various aspects of the present disclosure.

Referring to FIG. 2B, illustrated is a schematic view of an example of a single-port cell 152. The single-port cell 152 includes fin field-effect transistors (FinFETs). The single-port cell 152 includes a third inverter and a fourth inverter that are cross-coupled as a data storage. The third inverter includes a pull-up device 302 formed with a p-type fin field-effect transistor (pFinFET), referred to as PU-21. The third inverter includes a pull-down device 306 formed with an n-type fin field-effect transistor (nFinFET), referred to as PD-21. The drains of the PU-21 and PD-21 are electrically connected together, forming a storage node 316. The gates of PU-21 and PD-21 are electrically connected together. The source of PU-21 is electrically connected to a power line Vdd. The source of PD-21 is electrically connected to a complimentary power line Vss. The fourth inverter includes a pull-up device 304 formed with a pFinFET, referred to as PU-22. The fourth inverter also includes a pull-down device 308 formed with an nFinFET, referred to as PD-22. The drains of the PU-22 and PD-22 are electrically connected together, forming a storage node 314 (also referred to as a storage node bar 314). The gates of PU-22 and PD-22 are electrically connected together. The source of PU-22 is electrically connected to the power line Vdd. The source of PD-22 is electrically connected to the complimentary power line Vss. Furthermore, the storage node 316 is electrically connected to the gates of PU-22 and PD-22, and the storage node 314 is electrically connected to the gates of PU-21 and PD-21. Therefore, the third and fourth inverters are cross-coupled as illustrated in FIG. 2B.

The single-port cell 152 further includes a pass-gate device 310 formed with an n-type fin field-effect transistor (nFinFET), referred to as PG-21, and a pass-gate device 312 formed with an n-type fin field-effect transistor (nFinFET), referred to as PG-22. The source of the pass-gate device PG-21 is electrically connected to the storage node 316, and the source of the pass-gate device PG-22 is electrically connected to the storage node 314, forming a port for data access (e.g., read or write). Furthermore, the drain of PG-21 is electrically connected to a bit-line (BL), and the gate of PG-21 is electrically connected to a word line (WL). Similarly, the drain of PG-22 is electrically connected to a complementary bit-line (also referred to as bit-line bar (BLB)) or the bit-line BL, and the gate of PG-22 is electrically connected to the WL.

In various embodiments, the single-port cell 152 may include additional devices such as additional pull-down devices and pass-gate devices. In some examples, each of the first and second inverters includes one or more pull-down devices configured in parallel. In some embodiments, the single-port cell 152 is not coupled to a write assist circuitry.

Referring to FIGS. 3, 4A, 4B, 5A, 5B, 6, and 7, a method 350 for forming the integrated circuit 100 including two-port cells 104 and single-port cells 152 is described. In various embodiments, the threshold voltages of the various FinFETs of the two-port cell 104 and single-port cell 152 are tuned (e.g., by tuning the gate dielectric layer and/or work function layers of the FinFETs) to satisfy different requirements for the various FinFETs. In some embodiments, devices in the two-port cell 104 are designed to have different threshold voltages. For example, the pull-up devices of the two-port cell 104 are designed to have threshold voltages lower than the threshold voltages of the pull-down devices and/or pass-gate devices of the two-port cell 104 to improve cell stability. In some embodiments, devices in the single-port 152 are designed to have balanced threshold voltages to lower standby power consumption. In some embodiments, devices in the two-port cell 104 are designed to have threshold voltages different from the threshold voltages of the devices in the single-port cell 152. For example, pull-up devices of the two-port cell 104 are designed to have threshold voltages lower than the threshold voltages of the pull-up devices of the single-port cell 152 to achieve better cell stability and lower data retention voltages. For further example, the pull-down devices of the two-port cell 104 are designed to have threshold voltages lower than the threshold voltages of the pull-down devices of the single-port cell 152, such that the two-port cell 104 has more voltage headroom (e.g., a difference between Vdd and the threshold voltage) for higher speed applications.

Figure 3:
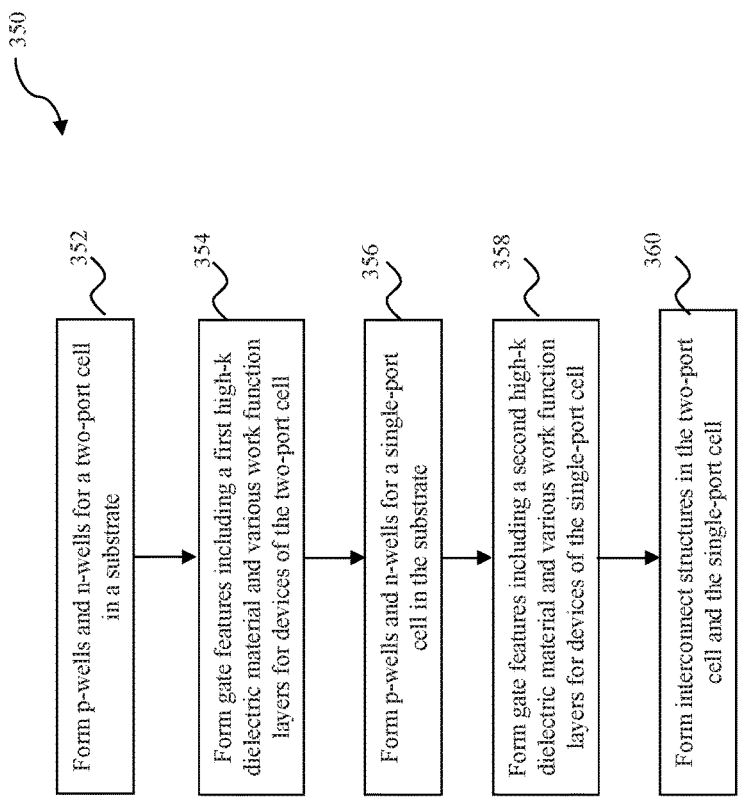
FIG. 3 is a flowchart of an embodiment of a method for making an integrated circuit according to various aspects of the present disclosure.
Figure 4A:
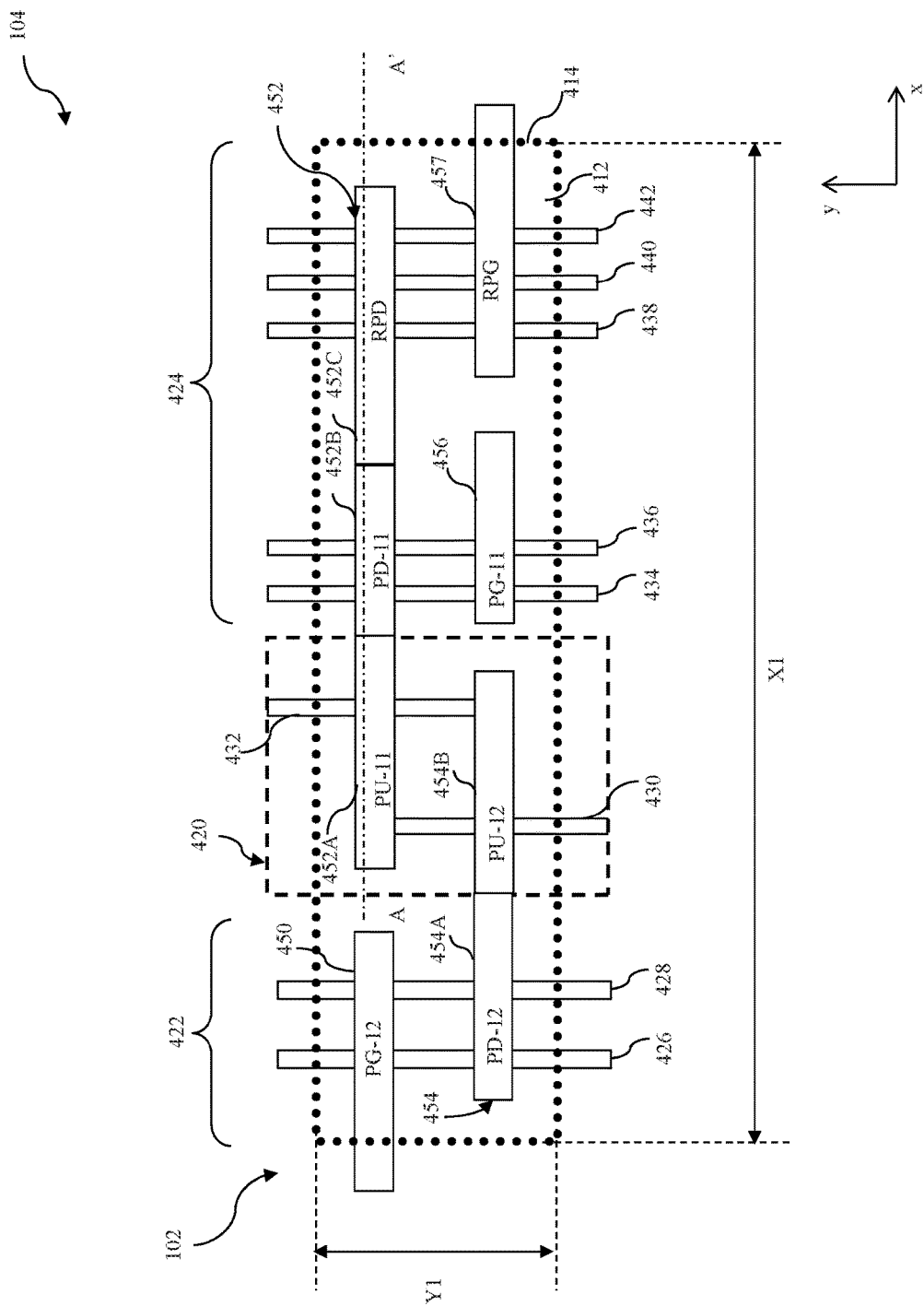
FIG. 4A is a top view of an embodiment of a two-port SRAM cell according to various aspects of the present disclosure.

Referring to FIG. 3, the method 350 begins at block 352, where p-wells and n-wells for two-port cells are formed in a substrate. Referring to the example of FIG. 4A, illustrated is a top view of a two-port cell 104 formed on a semiconductor substrate 102. The two-port cell 104 is formed in a unit cell region 412 of the semiconductor substrate 102. The unit cell region 412 is defined by the unit cell boundary 414. In one embodiment, the unit cell region 412 is defined in a rectangular shape spanning to a dimension X1 in the x direction, and spanning to a dimension Y1 in the y direction perpendicular to the x direction.

In some embodiments, the two-port cell 104 includes an n-well (region) 420 disposed in the central portion of the cell. The two-port cell 104 further includes a p-well (region) 422 disposed on one side of the n-well 420, and a p-well (region) 424 disposed on the other side of the n-well 420. In one embodiment, the n-well 420 and p-wells 422 and 424 are extended to multiple cells beyond the unit cell boundary 414. In some embodiments, the p-wells 422 and 424 are formed using a p-well lithography process and a p-well ion implantation process. In some examples, the p-well lithography process defines the dimensions of the p-wells 422 and 424. In some examples, the p-well ion implantation process uses a p-well doping dose to form the p-wells 422 and 424 with a first p-well dopant concentration. In some embodiments, the n-well 420 is formed using an n-well lithography process and an n-well ion implantation process. In some examples, the n-well lithography process defines the dimensions of the n-well 420. In some examples, the n-well ion implantation process uses an n-well doping dose to form the n-well 420 with a first n-well dopant concentration.

Figure 4B:
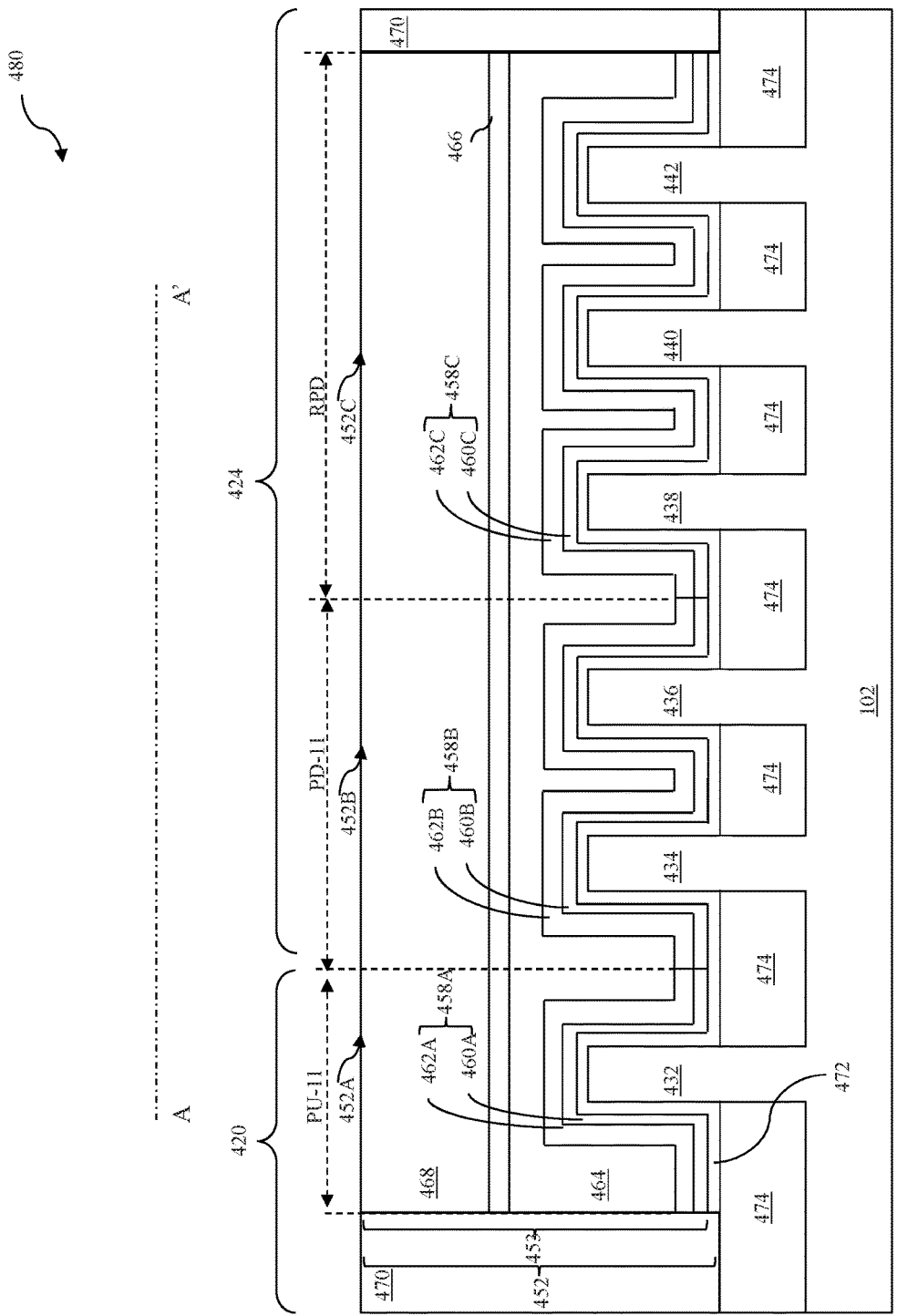
FIG. 4B is a cross-sectional view of an embodiment of a portion of the two-port SRAM cell of FIG. 4A according to various aspects of the present disclosure.

Referring to FIGS. 4A and 4B, in some embodiments, various fin active regions are defined in the substrate by isolation features and are isolated from each other by the isolation features. The isolation features are formed in the substrate with a proper technology. For example, the isolation features are utilized by shallow trench isolation (STI). In one embodiment, the two-port cell 104 includes active regions 426 and 428 formed in the p-well 422. The two-port cell 104 further includes active regions 430 and 432 formed in the n-well 420. The two-port cell 104 further includes active regions 434, 436, 438, 440, and 442 formed in the p-well 424. The active regions 426, 428, 430, 432, 434, 436, 436, 440, and 442 may be extended to multiple cells. Referring to FIG. 4B, illustrated is a cross-sectional view of a portion 480 of the two-port cell 104 of FIG. 4A along the line A-A'. The portion 480 includes a semiconductor substrate 102 including various isolation features 474, such as shallow trench isolation (STI), to separate the fin active regions. The portion 480 includes fin active region 432 in the n-well 420, and fin active regions 434, 436, 438, 440, and 442 in the p-well 424.

In various embodiments, the fin active regions and the STI features are formed in a processing sequence including forming trenches in the semiconductor substrate 102 and partially filling the trenches with a dielectric material. Alternatively, the trenches are completely filled with the dielectric material. Then a polishing process, such as chemical mechanical polishing (CMP) process is applied to remove the excessive dielectric material and planarize the surface. Thereafter, the formed STI features are partially removed to form the fin active regions using a selective etch such as hydrochloride (HF) wet etch. Particularly, the processing sequence includes etching trenches in the semiconductor substrate 102 and filling the trenches with one or more dielectric materials such as silicon oxide, silicon nitride, silicon oxynitride or combinations thereof. The filled trench may have a multi-layer structure such as a thermal oxide liner layer with silicon nitride filling the trench. In furtherance of the present embodiment, the STI features are created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

Referring to FIGS. 3, 4A, and 4B, the method 350 proceeds to block 354, where various gate structures are formed within the two-port cell 104 for various nFinFETs and pFinFETs.

In some embodiments, the formation of the gate structures utilizes a gate stack including a gate dielectric layer including a high-k dielectric material and a metal gate electrode including metal. In some embodiments, the formation of the gate structures may include a gate-last process, a gate-first process, or a combination thereof. In some embodiments, a gate-last process is used to form the gate structures. In the gate-last process, a dummy gate stack is formed on the substrate by depositions, lithography patterning and etching; source and drain features are formed adjacent to the dummy gate stack; an ILD material layer is formed on the substrate by deposition and polishing; the dummy gate stack is partially removed to form a trench; and then a high-k dielectric material and metal gate electrode are formed by depositions and polishing, according to another example. In the gate-first process, a gate stack of a high-k dielectric material and a metal electrode is formed on the substrate by depositions, lithography patterning and etching; source and drain features are formed (e.g., by various ion implantations); and an ILD material layer is formed on the substrate by deposition and polishing, such chemical mechanical polishing (CMP).

Referring to FIGS. 4A and 4B, illustrated is a two-port cell 104 (or a portion thereof) after gate structures are formed. In some examples, the two-port cell 104 includes a gate structure 450 disposed in the cell region unit cell region 412 and extended in the x direction over the active regions 426 and 428, forming the gates for PG-12. In some examples, the two-port cell 104 includes a gate structure 452 disposed in the unit cell region 412 and extended in the x direction over the active regions 432, 434, 436, 438, 440, and 442, forming the gates for PU-11, PD-11, and RPD. In other words, PU-11, PD-11, and RPD share a common gate structure 452. In some examples, the two-port cell 104 includes a gate structure 454 disposed in the unit cell region 412 and extended in the x direction over the active regions 426 and 428, forming the gates for PD-12 and PU-12. In some examples, the two-port cell 104 includes a gate structure 456 disposed in the unit cell region 412 and extended in the x direction over the active regions 434 and 436, forming the gate for PG-11. In some examples, the two-port cell 104 includes a gate structure 457 disposed in the unit cell region 412 and extended in the x direction over the active regions 438, 440, and 442, forming the gate for RPG.

In some embodiments, each of the gate structures 450, 452, 454, 456, and 457 may include interfacial layer(s), gate dielectric layer(s), a gate electrode, and/or other suitable materials for a metal gate structure. In some embodiments, the gate structure may further include capping layers, etch stop layers, and/or other suitable materials. The interfacial layer may include a dielectric material such as silicon oxide layer ($SiO_2$) or silicon oxynitride (SiON). The interfacial layer may be formed by chemical oxidation, thermal oxidation, atomic layer deposition (ALD), CVD, and/or other suitable proceses. The gate dielectric layer may include silicon dioxide or other suitable dielectric materials. In an embodiment, the gate dielectric is a high-k dielectric layer. The high-k dielectric layer may include hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, and/or other suitable material. The gate dielectric layer may be formed by atomic layer deposition (ALD), chemical vapor deposition (CVD), physical vapor deposition (PVD), and/or other suitable methods. In some embodiments, the gate electrode may include a metal composition. Examples of suitable metals for forming the gate electrode include Cu, W, Ti, Ta, TiN, TaN, NiSi, CoSi, and/or combinations thereof. The gate electrode material layer may be formed by conventional processes known in the art such as, physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), and/or other processes known in the art including photolithography and etching processes.

In various embodiments, the pull-up devices PU-11 and PU-12, the pull-down devices PD-11 and PD-12, the pass-gate devices PG-11, PG-12, the read pass-gate device RPG, and the read pull-down device RPD have different threshold voltages to improve the performance and power consumption of the two-port cell 104. In some examples, the pull-up devices PU-11 and PU-12 are designed to have a threshold voltage Vt1. The pull-down devices PD-11 and PD-12 and/or the pass-gate devices PG-11 and PG-12 are designed to have a threshold voltage Vt2 higher than the threshold voltage Vt1 (e.g., by more than about 40 mV). The read pull-down device (RPD) and/or read pass-gate device (RPD) is designed to have a threshold voltage Vt3 lower than the threshold voltage Vt2 (e.g., by more than about 40 mV). In some embodiments, the gate electrodes of the gate structures of the two-port cell 104 may include work function layers having different work functions for achieving different threshold voltages Vt1, Vt2, and Vt3 of the FinFETs.

Referring to FIG. 4B, illustrated is a cross-sectional view of a portion 480 of the two-port cell 104 of FIG. 4A along the line A-A', where a common gate structure 452 is disposed on fin active regions of PU-11, PD-11, and RPD. The common gate structure 452 is disposed adjacent to an ILD layer 470 including a dielectric material. The common gate structure 452 includes a gate dielectric layer 472 disposed over the isolation features 474 and the fin active regions 432, 434, 436, 438, 440, and 442, and a gate electrode 453 disposed over the gate dielectric layer 472. In some embodiments, the gate dielectric layer 472 has a thickness between about 5 Angstrom (Å) and 20 Å. Different portions of the common gate structure 452 include different work function layers configured based on the desirable threshold voltages of the corresponding devices.

In the example of FIG. 4B, a portion 452A of the common gate structure 452 is disposed over the fin active region 432 and forms a gate for PU-11. A portion 452B of the common gate structure 452 is disposed over the fin active regions 434 and 436, and forms a gate for PD-11. A portion 452C of the common gate structure 452 is disposed over the fin active regions 438, 440, and 442, and forms a gate for RPD. Portions 452A, 452B, and 452C of the gate structure 452 include different work function layers 458A, 458B, and 458C respectively. The work function layers may be configured to include different materials and/or different sub-layers to achieve different threshold voltages for the PU-11, PD-11, and RPD. The work function layers may be deposited by CVD, PVD, and/or other suitable process.

In some embodiments, portion 452A includes work function layer 458A, which includes a conductive layer of metal or metal alloy with a proper work function, such that the pull-up device PU-11 has a threshold voltage Vt1. In an example, the work function layer 458A has a work function close to or higher than the silicon valence band energy (Ev), presenting strong electron bonding energy to the nuclei. For example, the work function layer 458A has a work function of about 5.2 eV or higher. In some examples, the work function layer 458A includes a refractory metal, a metal selected from p-type work function metals, including TiN, TaN, Ru, Mo, Al, WN, $ZrSi_2$, $MoSi_2$, $TaSi_2$, $NiSi_2$, WN, other suitable p-type work function materials, or combinations thereof. In an example, the work function layer 458A includes a work function sub-layer 460A formed over the gate dielectric layer 472. The work function sub-layer 460A may include TaN, and have a thickness between about 5 Angstrom (Å) and 20 Å. In some embodiments, the work function layer 458A may include a work function sub-layer 462A disposed over the work function sub-layer 460A. In an example, the work function sub-layer 462A includes TiN, and has a thickness between about 10 Å and 40 Å. In some embodiments, the threshold voltage Vt1 of the PMOS device PU-11 is tuned by adjusting the thickness of the work function sub-layers 460A and 462A. For example, by increasing the thickness of the work function sub-layers 460A and/or 462A, a lower threshold voltage is achieved. In some embodiments, the work function layer 458A has a thickness between about 30 Angstrom (Å) and about 80 Å.

In some embodiments, portion 452B includes work function layer 458B, which includes a conductive layer of metal or metal alloy with a proper work function, such that the pull-down device PD-11 has a threshold voltage Vt2. In an example, the work function layer 458B has a work function close to or lower than the silicon conduction band energy (Ec), presenting easier electron escape. For example, the work function layer 458B has a work function of about 4.2 eV or less. In some examples, the work function layer 458B may include a refractory metal, a metal selected from n-type work function metals, including TiN, TaN, Ti, Ag, TaAl, TaAlC, TiAlN, TaAlN, TaC, TaCN, TaSiN, Mn, Zr, other suitable n-type work function materials, or combinations thereof. In an example, the work function layer 458B includes a work function sub-layer 460B formed over the gate dielectric layer 472. The work function sub-layer 460B may include TaN or TiN, and have a thickness between about 5 Å and 20 Å. In some embodiments, the work function layer 458B may include a work function sub-layer 462B with a thickness between about 10 Å and 40 Å disposed over the work function sub-layer 460B. In some embodiments, a work function layer including a higher percent composition of Al has a threshold voltage lower than that of a work function layer including a lower percent composition of Al. As such, the work function layer 458B may be tuned to include various compounds including Al (e.g., TiAl, $TiAl_2$, $TiAl_3$, and/or a combination thereof) to have a particular percent composition of Al, so that the work function layer 458B has a proper work function to achieve the desired threshold voltage Vt2. In some embodiments, the pull-down devices PD-11 and PD-12 and/or the pass-gate devices PG-11, PG-12 are designed to have a threshold voltage Vt2 higher than the threshold voltage Vt1 (e.g., by more than about 40 mV). In some embodiments, a thickness of the work function sub-layer 460B disposed between the work function sub-layer 462B containing Al and the gate dielectric layer 472 may be controlled to tune the threshold voltage. In an example, by increasing the thickness of the work function sub-layer 460B, the threshold voltage is increased.

In some embodiments, portion 452C includes work function layer 458C, which includes a conductive layer of metal or metal alloy with a proper work function, such that the read pull-down device RPD has a threshold voltage Vt3. In an example, the work function layer 458C has a work function close to or lower than the silicon conduction band energy (Ec), presenting easier electron escape. For example, the work function layer 458C has a work function of about 4.2 eV or less. The work function layer 458C may include a refractory metal, a metal selected from n-type work function metals, including TiN, TaN, Ti, Ag, TaAl, TaAlC, TiAlN, TaAlN, TaC, TaCN, TaSiN, Mn, Zr, other suitable n-type work function materials, or combinations thereof. In an example, the work function layer 458C includes a work function sub-layer 460C formed over the gate dielectric layer 472. The work function sub-layer 460C may include TaN or TiN, and have a thickness between about 5 Å and 20 Å. In some embodiments, the work function layer 458C may include a work function sub-layer 462C with a thickness between about 10 Å and 40 Å disposed over the work function sub-layer 460C. In an example, the work function sub-layer 462C includes a material including $TaAl_3$, $TaAl_4$, $TaAl_5$, $TiAl_4$, $TiAl_5$, $TiAl_7$, $TiAl_8$, or a combination thereof. In some embodiments, the work function layer 458C may be tuned to include various compounds including Al (e.g., $TaAl_3$, $TaAl_4$, $TaAl_5$, $TiAl_4$, $TiAl_5$, $TiAl_7$, $TiAl_8$) to have a particular percent composition of Al based on the desired threshold voltage Vt3. In some examples, it is configured that the threshold voltage Vt3 is lower than the threshold voltage Vt2. In such examples, the work function layer 458C has a percent composition of Al higher than that of the work function layer 458B. In such examples, the work function layer 458C has a work function that is lower than the work function of the work function layer 458B. In an example, the work function layer 458C has a work function that is lower than the work function of the work function layer 458B by between about 10% to about 30%. In an example, the threshold voltage Vt3 is lower than the threshold voltage Vt2 by more than about 40 mV. In some embodiments, a thickness of the work function sub-layer 460C disposed between the work function sub-layer 462C containing Al and the gate dielectric layer 472 may be controlled to tune the threshold voltage Vt3. In an example, by reducing the thickness of the work function sub-layer 460C, the threshold voltage Vt3 is decreased. In an example, the thickness of the work function sub-layer 460C is less than the thickness of the work function sub-layer 460B (e.g., by more than about 10 Å).

In some embodiments, the gate structure 452 includes a metal layer 464 formed over the work function layers 458A, 458B, and 458C. The metal layer 464 may include TiN, TiAl, TiAlN, TaN, TaAl, TaAlN, TaAlC, TaCN, other suitable metals, or combination thereof. In some examples, the metal layer 464 may include multiple layers. The metal layer 464 may have a thickness between about 20 Å and 120 Å. The metal layer 464 may be formed by CVD, PVD, plating, and/or other suitable processes. In some embodiments, a thickness of the portion of the barrier metal layer 466 corresponding to a particular device may In some embodiments, the gate structure 452 includes a barrier metal layer 466 disposed over the metal layer 464. In an example, the barrier metal layer 466 includes TiN, and has a thickness between about 10 Å and 40 Å. The barrier metal layer 466 may be formed by CVD, PVD, plating, and/or other suitable processes.

In some embodiments, the gate structure 452 includes a fill metal layer 468, which may include Al, W, or Cu and/or other suitable materials. In an example, the fill metal layer 468 includes a low resistance metal. The fill metal layer 468 may be formed by CVD, PVD, plating, and/or other suitable processes.

Referring to FIG. 4A, the gate structures 450, 454, 456, and 457 may include work function layers having proper work functions such that the corresponding FinFETs have desired threshold voltages. In some examples, the pass-gate devices PG-12 and PG-11 have threshold voltages that are substantially the same as the threshold voltage Vt2 of the pull-down device PD-11. In such examples, the gate structures 450 and 456 forming the gates of pass-gate devices PG-12 and PG-11 include work function layers having work functions substantially the same as the work function of the work function layer 458B of PD-11. In an example, the work function layers of the gate structures 450 and 456 are substantially similar to the work function layer 458B of PD-11.

In some examples, the read pass-gate device RPG has a threshold voltage that is substantially the same as the threshold voltage Vt3 of read pull-down device RPD. In such examples, the gate structure 457 forming the gate of the RPG includes a work function layer having a work function substantially the same as the work function of the read pull-down device RPD. In an example, the work function layer of the gate structure 457 is substantially the same as the work function layer 458C of the read pull-down device RPD.

In some examples, a common gate structure 454 is disposed on fin active regions of pull-down device PD-12 and pull-up device PU-12. A portion 454A forms a gate of the pull-down device PD-12, and a portion 454B forms a gate of the pull-up device PU-12. In some examples, the PD-12 has a threshold voltage substantially the same as the threshold voltage Vt2 of the PD-11. In such examples, the portion 454A includes a work function layer having a work function substantially the same as the work function of the work function layer 458B. In an example, the work function layer of the portion 454A is substantially the same as the work function layer 458B of the PD-11. In some examples, the PU-12 has a threshold voltage substantially the same as the threshold voltage Vt1 of the PU-11. In such examples, the portion 454B includes a work function layer having a work function substantially the same as the work function of the work function layer 458A. In an example, the work function layer of the portion 454B is substantially the same as the work function layer 458A of the PU-11.

Referring to FIG. 3, the method 350 begins at block 356, where p-wells and n-wells for a single-port cell are formed in the substrate. Referring to the example of FIG. 5A, the single-port cell 152 is formed in a unit cell region 512 of the semiconductor substrate. The unit cell region 512 is defined by the unit cell boundary 514. In one embodiment, the unit cell region 512 is defined in a rectangular shape spanning to a dimension X2 in the x direction, and spanning to a dimension Y2 in the y direction perpendicular to the x direction. The dimension X2 is longer than the dimension Y2, and the dimensions X2 and Y2 are referred to as a longer pitch and a shorter pitch, respectively, of the single-port cell 152.

The single-port cell 152 includes an n-well (region) 520 disposed in the central portion of the unit cell region 512. The two-port cell 104 further includes a p-well (region) 522 disposed on one side of the n-well 520, and a p-well (region) 524 disposed on the other side of the n-well 520. In one embodiment, the n-well 520 and p-wells 522 and 524 are extended to multiple cells beyond the unit cell boundary 514. In some embodiments, the p-wells 522 and 524 are formed using a p-well lithography process and a p-well ion implantation process. In some examples, the p-well lithography process defines the dimensions of the p-wells 522 and 524. In some examples, the p-well ion implantation process uses a p-well doping dose to form the p-wells 522 and 524 with a second p-well dopant concentration. In some examples, the second p-well dopant concentration is different from the first p-well dopant concentration of the p-wells 422 and 424. In some examples, the second p-well dopant concentration is substantially the same as the first p-well dopant concentration of the p-wells 422 and 424. In some embodiments, the n-well 520 is formed using an n-well lithography process and an n-well ion implantation process. In some examples, the n-well lithography process defines the dimensions of the n-well 520. In some examples, the n-well ion implantation process uses an n-well doping dose to form the n-well 520 with a second n-well dopant concentration. In some examples, the second n-well dopant concentration is different from the first n-well dopant concentration of the n-well 420. In some examples, the second n-well dopant concentration is substantially the same as the first n-well dopant concentration of the n-well 420.

Figure 5A:
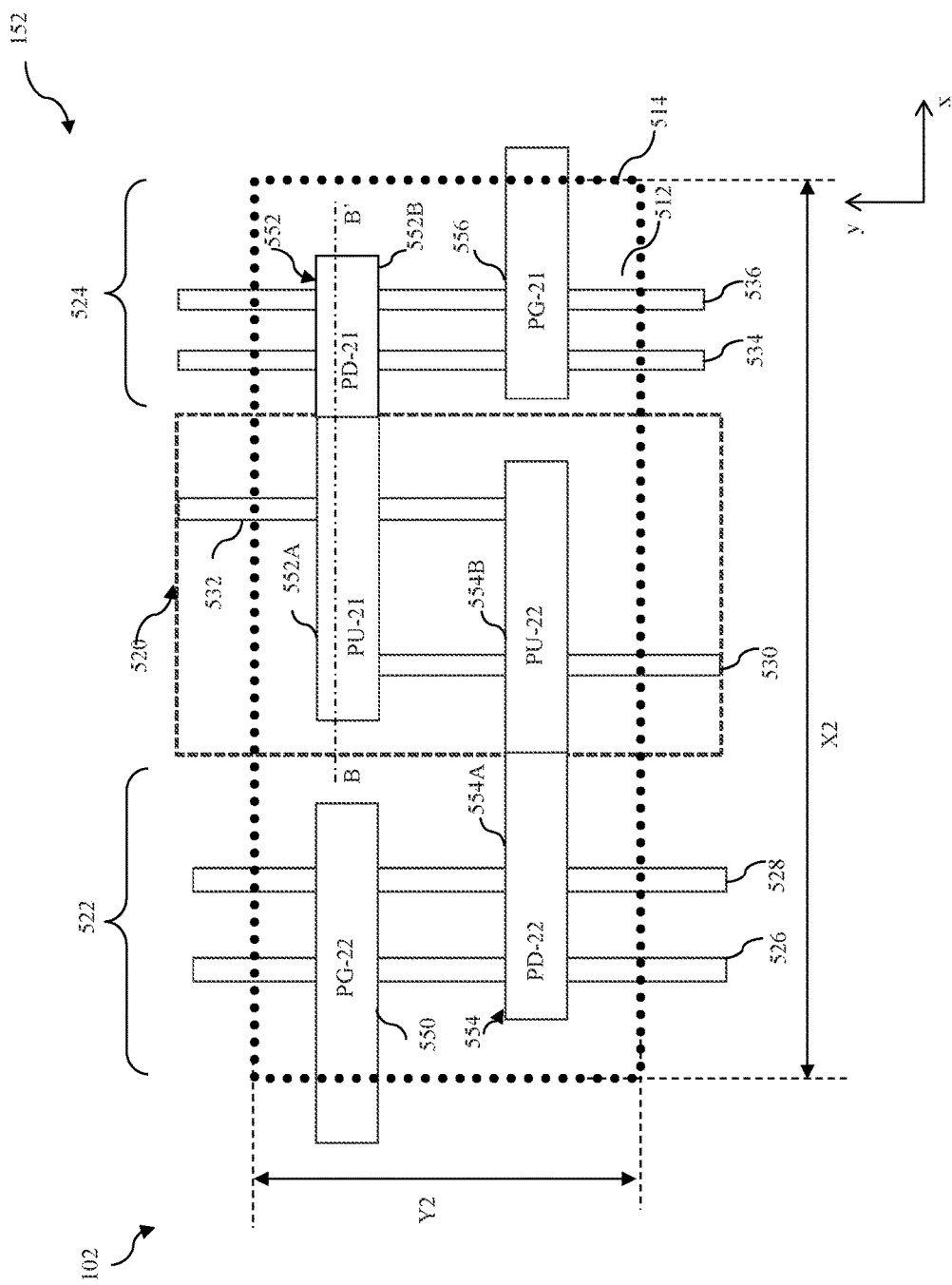
FIG. 5A is a top view of an embodiment of a single-port SRAM cell according to various aspects of the present disclosure.
Figure 5B:
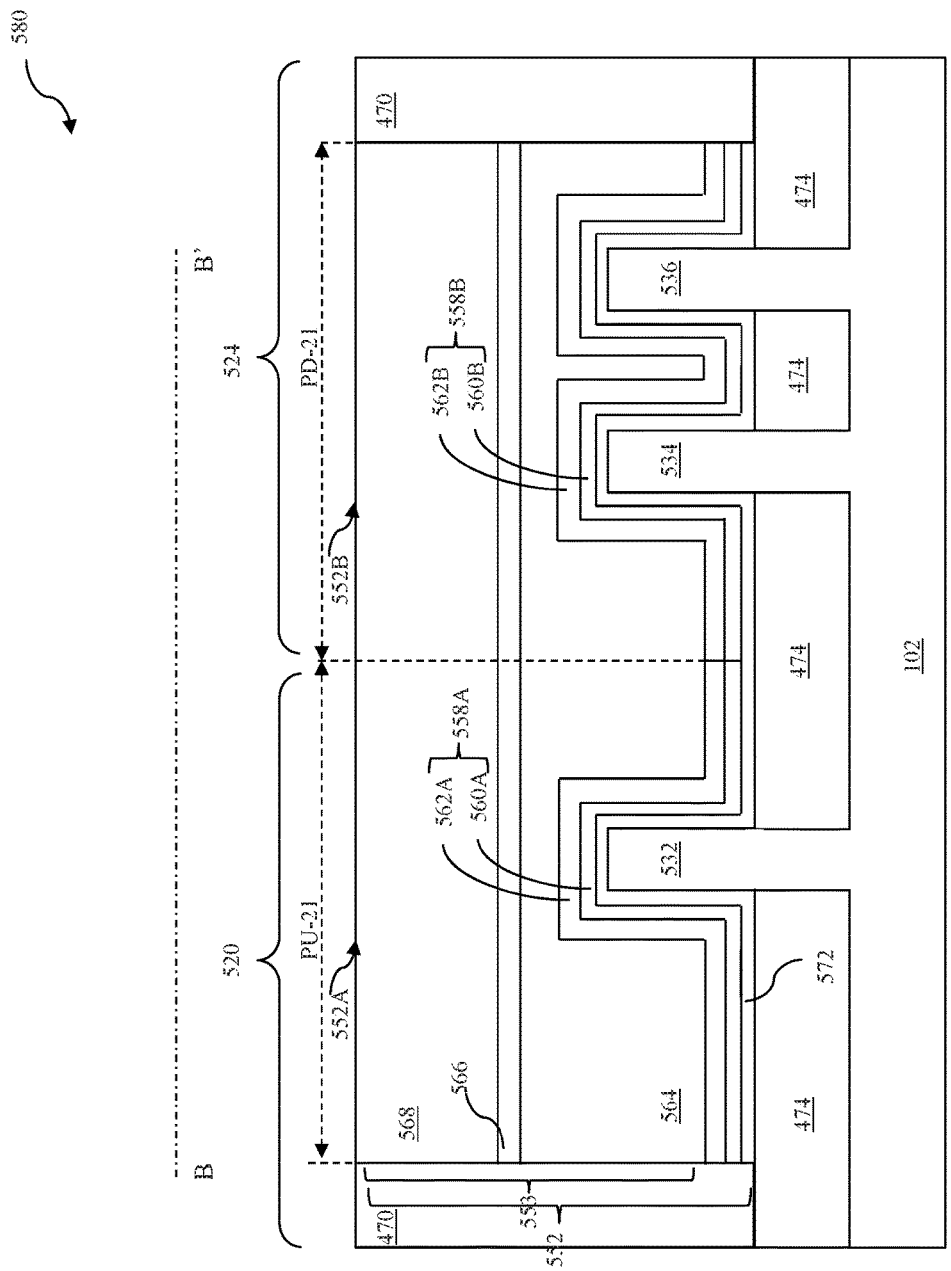
FIG. 5B is a cross-sectional view of an embodiment of a portion of the single-port SRAM cell of FIG. 5A according to various aspects of the present disclosure.

Referring to FIGS. 5A and 5B, in some embodiments, various fin active regions are defined in the substrate by isolation features and are isolated from each other by the isolation features. The isolation features are formed in the substrate with a proper technology. For example, the isolation features are utilized by STI. In one embodiment, the single-port cell 152 includes active regions 526 and 528 formed in the p-well 522. The single-port cell 152 further includes active regions 530 and 532 formed in the n-well 520. The single-port cell 152 further includes active regions 534 and 536 formed in the p-well 524. The active regions 526, 528, 530, 532, 534, and 536 may be extended to multiple cells (e.g., multiple single-port cells of the array 150). Referring to FIG. 5B, illustrated is a cross-sectional view of a portion 580 of the single-port cell 152 of FIG. 5A along the line B-B'. The portion 580 includes a semiconductor substrate 102 including various isolation features 474, such as shallow trench isolation (STI), to separate the fin active regions. The portion 580 includes fin active region 532 in the n-well 520, and fin active regions 534 and 536 in the p-well 524.

In various embodiments, the fin active regions and the STI features are formed in a processing sequence including forming trenches in the semiconductor substrate 102 and partially filling the trenches with a dielectric material. Alternatively, the trenches are completely filled with the dielectric material. Then a polishing process, such as chemical mechanical polishing (CMP) process is applied to remove the excessive dielectric material and planarize the surface. Thereafter, the formed STI features are partially removed to form the fin active regions using a selective etch such as hydrochloride (HF) wet etch. Particularly, the processing sequence includes etching trenches in the semiconductor substrate 102 and filling the trenches with one or more dielectric materials such as silicon oxide, silicon nitride, silicon oxynitride or combinations thereof. The filled trench may have a multi-layer structure such as a thermal oxide liner layer with silicon nitride filling the trench. In furtherance of the present embodiment, the STI features are created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

Referring to FIGS. 3, 5A, and 5B, the method 350 proceeds to block 358, where various gate structures are formed within the single-port cell 152 for various nFinFETs and pFinFETs.

In some embodiments, the formation of the gate structures utilizes a gate stack including a gate dielectric layer including a high-k dielectric material and a metal gate electrode including metal. In some embodiments, the formation of the gate structures may include a gate-last process, a gate-first process, or a combination thereof. In some embodiments, a gate-last process is used to form the gate structures. In the gate-last process, a dummy gate stack is formed on the substrate by depositions, lithography patterning and etching; source and drain features are formed adjacent to the dummy gate stack; an ILD material layer is formed on the substrate by deposition and polishing; the dummy gate stack is partially removed to form a trench; and then a high-k dielectric material and metal gate electrode is formed in the trench by deposition and polishing, according to one example. In the gate-first process, a gate stack of a high-k dielectric material and a metal electrode is formed on the substrate by depositions, lithography patterning and etching; source and drain features are formed (e.g., by various ion implantations); and an ILD material layer is formed on the substrate by deposition and polishing, such chemical mechanical polishing (CMP).

Referring to the examples of FIGS. 5A and 5B, illustrated is a single-port cell 152 (or a portion thereof) after gate structures are formed. Referring to the example of FIG. 5A, illustrated is a top view of a single-port cell 152. The single-port cell 152 is formed on a semiconductor substrate 102 and includes various FinFETs. In some embodiments, the single-port cell 152 is formed on the semiconductor substrate 102 of the integrated circuit 100 of FIG. 1.

Various gate structures are formed within the single-port cell 152 for various nFinFETs and pFinFETs. In some examples, the single-port cell 152 includes a gate structure 550 disposed in the cell region unit cell region 512 and extended in the x direction over the active regions 526 and 528, forming the gates for PG-22. In some examples, the single-port cell 152 includes a gate structure 552 disposed in the unit cell region 512 and extended in the x direction over the active regions 532, 534, and 536, forming the gates for PU-21 and PD-21. In some examples, the single-port cell 152 includes a gate structure 554 disposed in the unit cell region 512 and extended in the x direction over the active regions 526 and 528, forming the gates for PD-22 and PU-22. In some examples, the single-port cell 152 includes a gate structure 556 disposed in the unit cell region 512 and extended in the x direction over the active regions 534 and 536, forming the gate for PG-21.

In some embodiments, each of the gate structures 550, 552, 554, and 556 may include interfacial layer(s), gate dielectric layer(s), a gate electrode, and/or other suitable materials for a metal gate structure. In some embodiments, the gate structure may further include capping layers, etch stop layers, and/or other suitable materials. The interfacial layer may include a dielectric material such as silicon oxide layer ($SiO_2$) or silicon oxynitride (SiON). The interfacial layer may be formed by chemical oxidation, thermal oxidation, atomic layer deposition (ALD), CVD, and/or other suitable proceses. The gate dielectric layer may include silicon dioxide or other suitable dielectric materials. In an embodiment, the gate dielectric is a high-k dielectric layer. The high-k dielectric layer may include hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, and/or other suitable material. The gate dielectric layer may be formed by atomic layer deposition (ALD), chemical vapor deposition (CVD), physical vapor deposition (PVD), and/or other suitable methods. In some embodiments, the gate electrode may include a metal composition. Examples of suitable metals for forming the gate electrode include Cu, W, Ti, Ta, TiN, TaN, NiSi, CoSi, and/or combinations thereof. The gate electrode material layer may be formed by conventional processes known in the art such as, physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), and/or other processes known in the art including photolithography and etching processes.

In various embodiments, the pull-up devices PU-21 and PU-22, the pull-down devices PD-21 and PD-22, and/or the pass-gate devices PG-21, PG-22 of the single-port cell 152 are designed to have various threshold voltages. In some embodiments, devices of the single-port cell 152 have balanced threshold voltages higher than threshold voltages of devices of the two-port cell 104, so that the single-port cell 152 has lower standby power consumption than the two-port cell 104. In such embodiments, both NMOSFET (e.g., pull-down devices PD-21 and PD-22, and/or the pass-gate devices PG-21, PG-22) and PMOSFET (e.g., pull-up devices PU-21 and PU-22) of the single-port cell 152 have threshold voltages (e.g., saturation threshold voltage $Vt\_sat > 0.2V$) greater than the threshold voltages of the devices (e.g., the threshold voltage Vt1 of the pull-up devices PU-11 and PU-12 and/or threshold voltage Vt2 of the pull-down devices PD-11 and PD-12) of the two-port cell 104. In some examples, the pull-up devices PU-21 and PU-22 are designed to have a threshold voltage Vt4 greater than the threshold voltage Vt1 of the pull-up devices PU-11 and PU-12 of the two-port cell 104 (e.g. by more than 40 mV). In some examples, the pull-down devices PD-21 and PD-22 and/or the pass-gate devices PG-21 and PG-22 are designed to have a threshold voltage Vt5 greater than the threshold voltage Vt2 of the pull-down devices PD-11 and PD-12 of the two-port cell 104 (e.g., by more than 40 mV). In some embodiments, the difference between the threshold voltages Vt4 and Vt5 are within about 50 mV. Alternatively, in some examples, the pull-down devices PD-21 and PD-22 and/or the pass-gate devices PG-21 and PG-22 are designed to have a threshold voltage Vt5 that is substantially the same as the threshold voltage Vt2 of the pull-down devices PD-11 and PD-12 of the two-port cell 104. In various embodiments, the gate electrodes of the gate structures of the single-port cell 152 may include work function layers having different work functions to achieve the desired threshold voltages Vt4 and Vt5.

Referring to FIG. 5B, illustrated is a cross-sectional view of a portion 580 of the single-port cell 152 of FIG. 5A along the line B-B', where a common gate structure 552 is disposed on fin active regions of PU-21 and PD-21. The common gate structure 552 includes a gate dielectric layer 572 disposed over the isolation features 474 and the fin active regions 532, 534, and 536. In some examples, the gate dielectric layer 572 includes a high-k dielectric material that is the same as the high-k dielectric material of the gate dielectric layer 472 as discussed above with reference to FIG. 4B. In some examples, the gate dielectric layer 572 includes a high-k dielectric material that is different from the high-k dielectric material of the gate dielectric layer 472 as discussed above with reference to FIG. 4B. In some embodiments, the gate dielectric layer 572 has a thickness between about 5 Angstrom (Å) and 20 Å. In some embodiments, the thickness of the gate dielectric layer 572 is substantially similar to the thickness of the gate dielectric layer 472. The common gate structure 552 further includes a gate electrode 553 disposed over the gate dielectric layer 572. Different portions of the common gate structure 552 include work function layers having different work functions to achieve the desired threshold voltages of the corresponding devices.

In the example of FIG. 5B, a portion 552A of the common gate structure 552 is disposed over the fin active region 532 and forms a gate for PU-21. A portion 552B of the common gate structure 552 is disposed over the fin active regions 434 and 436, and forms a gate for PD-21. Portions 552A and 552B of the gate structure 452 include different work function layers 558A and 558B respectively. The work function layers 558A and 558B may be configured to include different materials and/or different sub-layers to have different work functions for achieving different threshold voltages for the PU-21 and PD-21. The work function layers may be deposited by CVD, PVD, and/or other suitable process.

In some embodiments, portion 552A includes work function layer 558A having a proper work function, so that the pull-up device PU-21 has a threshold voltage Vt4. In an example, the work function layer 558A has a work function close to or higher than the silicon valence band energy (Ev), presenting strong electron bonding energy to the nuclei. For example, the work function layer 558A has a work function of about 5.2 eV or higher. The work function layer 558A may include a refractory metal, a metal selected from p-type work function metals, including TiN, TaN, Ru, Mo, Al, WN, $ZrSi_2$, $MoSi_2$, $TaSi_2$, $NiSi_2$, WN, other suitable p-type work function materials, or combinations thereof. In an example, the work function layer 558A includes a work function sub-layer 560A formed over the gate dielectric layer 572. The work function sub-layer 560A may include TaN, and have a thickness between about 5 Å and 20 Å. In some embodiments, the work function sub-layer 558A may include a work function sub-layer 562A disposed over the work function sub-layer 560A. In an example, the work function sub-layer 562A includes TiN, and has a thickness between about 10 Å and 40 Å. In some embodiments, the work function layer 558A has a work function so that the pull-up device PU-21 has a threshold voltage Vt4 that is greater than the threshold voltage Vt1 of the PU-11 (e.g., by more than about 40 mV). In various embodiments, the threshold voltage Vt4 of the PMOS device PU-21 is tuned by adjusting the thickness of the work function sub-layers 560A and 562A. For example, by decreasing the thickness of the work function sub-layers 560A and/or 562A, a higher threshold voltage is achieved. In some embodiments, the work function layer 558A has a thickness between about 10 Angstrom (Å) and about 40 Å. In an example, the work functional layer 558A of the pull-up device PU-21 has a thickness less than a thickness of the work function 458A of the PU-11 (e.g., by more than about 10 Å).

In some embodiments, portion 552B includes work function layer 558B having a proper work function so that the pull-down device PD-21 has a threshold voltage Vt5. In an example, the work function layer 558B has a work function close to or lower than the silicon conduction band energy (Ec), presenting easier electron escape. For example, the work function layer 558B has a work function of about 4.2 eV or less. The work function layer 558B may include a refractory metal, a metal selected from n-type work function metals, including TiN, TaN, Ti, Ag, TaAl, TaAlC, TiAlN, TaAlN, TaC, TaCN, TaSiN, Mn, Zr, other suitable n-type work function materials, or combinations thereof. In an example, the work function layer 558B includes a work function sub-layer 560B formed over the gate dielectric layer 572. The work function sub-layer 560B may include TaN or TiN, and have a thickness between about 5 Å and 20 Å. In some embodiments, the work function layer 458B may include a work function sub-layer 562B with a thickness between about 10 Å and 40 Å disposed over the work function sub-layer 560B. In an example, the work function sub-layer 562B includes a material including TiAl, $TiAl_2$, $TiAl_3$, or a combination thereof. In some embodiments, a device including a work function layer with a higher percent composition of Al has a lower threshold voltage. As such, the work function layer 558B may be tuned to include various compounds including Al (e.g., TiAl, $TiAl_2$, $TiAl_3$) to have a particular percent composition of Al based on the desired threshold voltage Vt5. In some examples, the threshold voltage Vt5 is substantially the same as the threshold voltage Vt2. In such examples, the work function layer 558B has a work function that is substantially the same as the work function of the work function layer 458B of PD-11. For example, the work function layer 558B may be substantially the same as the work function layer 458B, and/or have a percent composition of Al substantially the same as that of the work function layer 458B. Alternatively, in some examples, the threshold voltage Vt5 is greater than the threshold voltage Vt2. In such examples, the work function layer 558B has a work function that is lower than the work function of the work function layer 458B of PD-11. For example, the work function layer 558B may have a percent composition of Al lower than that of the work function layer 458B. In an example, the threshold voltage Vt5 is greater than the threshold voltage Vt2 by more than about 40 mV.

In some embodiments, the gate structure 552 includes a metal layer 564 formed over the work function layers 558A and 558B. The metal layer 564 may include TiN, TiAl, TiAlN, TaN, TaAl, TaAlN, TaAlC, TaCN, other suitable metals, or combination thereof. In some examples, the metal layer 564 may include multiple layers. The metal layer 564 may have a thickness between about 20 Å and 120 Å. The metal layer 564 may be formed by CVD, PVD, plating, and/or other suitable processes.

In some embodiments, the gate structure 552 includes a barrier metal layer 566 disposed over the metal layer 564. In an example, the barrier metal layer 566 includes TiN, and has a thickness between about 10 Å and 40 Å. The barrier metal layer 566 may be formed by CVD, PVD, plating, and/or other suitable processes.

In some embodiments, the gate structure 552 includes a fill metal layer 568, which may include Al, W, or Cu and/or other suitable materials. In an example, the fill metal layer 568 includes a low resistance metal. The fill metal layer 468 may be formed by CVD, PVD, plating, and/or other suitable processes.

Referring to FIG. 5A, the gate structures 550, 554, and 556 may include work function layers having proper work functions to achieve desired threshold voltages of the corresponding devices. In some examples, the pass-gate devices PG-22 and PG-21 have threshold voltages that are substantially the same as the threshold voltage Vt5 of the pull-down device PD-21. In such examples, the gate structures 550 and 556 forming the gates of pass-gate devices PG-22 and PG-21 include work function layers substantially the same as the work function layer 558B of PD-21.

In some examples, a common gate structure 554 is disposed on fin active regions of pull-down device PD-22 and pull-up device PU-22. A portion 554A of the gate structure 554 forms a gate of the pull-down device PD-22, and a portion 554B of the gate structure 554 forms a gate of the pull-up device PU-22. In some examples, the PD-22 has a threshold voltage substantially the same as the threshold voltage Vt5 of the PD-21. In such examples, the portion 554A includes a work function layer having a work function substantially the same as the work function of the work function layer 558B of the PD-21. In some examples, the PU-22 has a threshold voltage substantially the same as the threshold voltage Vt4 of the PU-21. In such examples, the portion 554B includes a work function layer having a work function substantially the same as the work function of the work function layer 558A of the PU-21.

Figure 6:
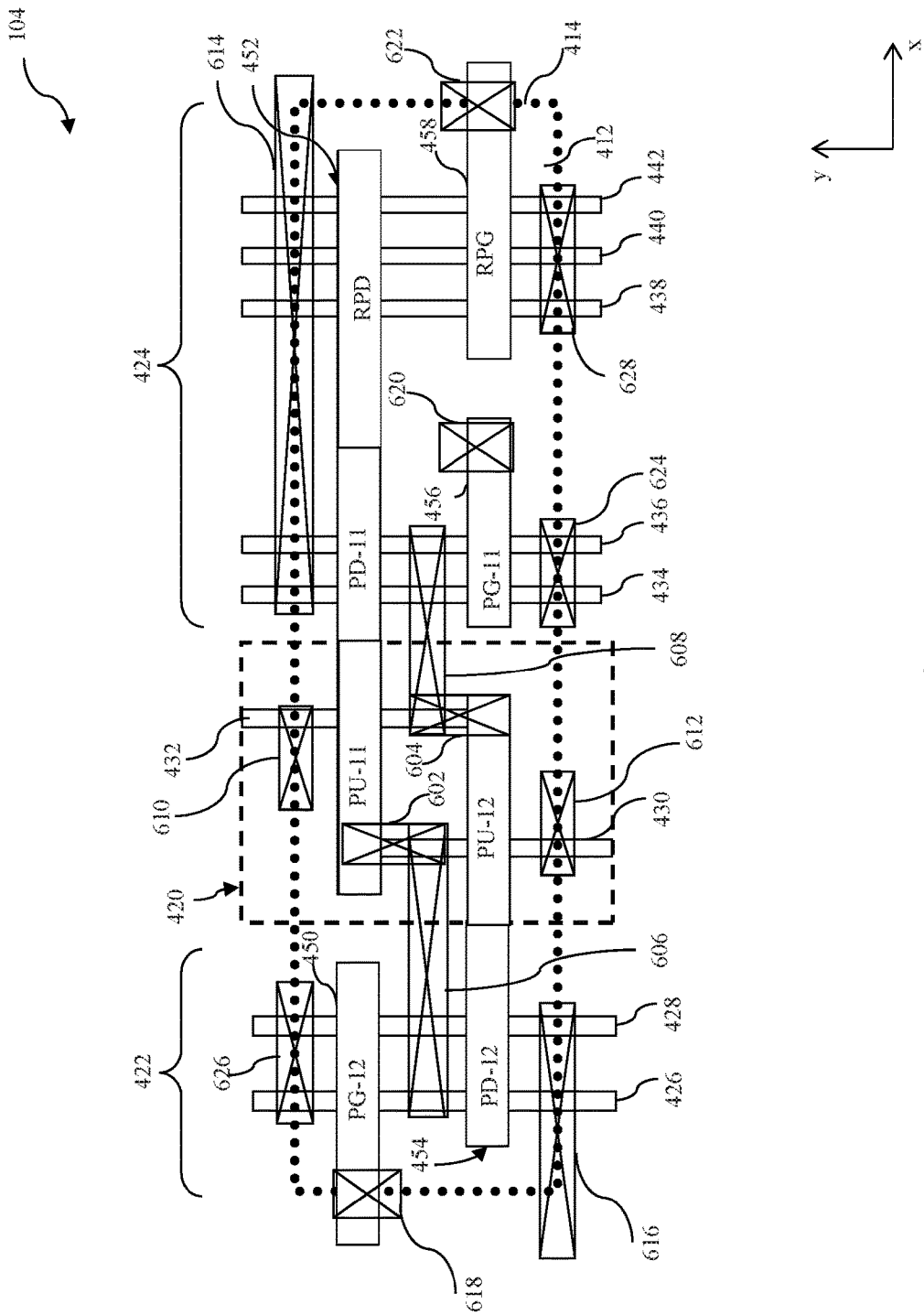
FIG. 6 is a top view of an embodiment of a two-port SRAM cell according to various aspects of the present disclosure.
Figure 7:
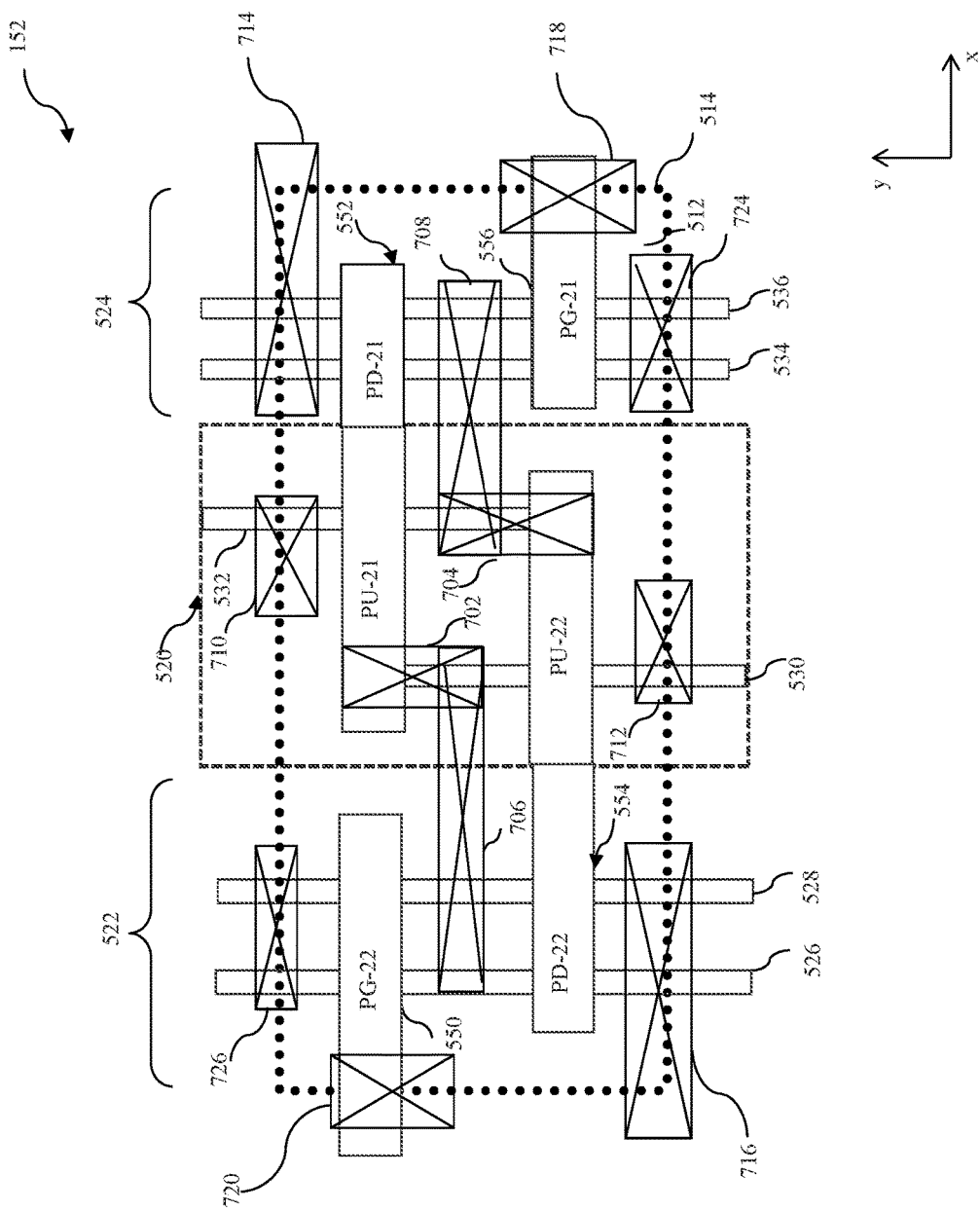
FIG. 7 is a top view of an embodiment of a single-port SRAM cell according to various aspects of the present disclosure.

Referring to FIGS. 3, 6, and 7, the method 350 proceeds to block 360, where interconnect structures are formed in the two-port cell and single-port cell.

Referring to the example of FIG. 6, illustrated is a top view of the two-port cell 104 including interconnect routings. In various embodiments, various interconnect structures may be utilized to couple the nFinFETs and pFinFETs to form the functional two-port cell 104.

The nFinFETs and pFinFETs may be electrically connected in various ways. In some embodiments, the drain of PD-11 is electrically connected to the source of PG-11 by sharing a common doped region, a region defined in the active regions 434 and 436 and positioned between the PD-11 and PG-11. In some embodiments, the drain of PD-11 is electrically connected to the source of PG-11 by a silicide feature formed on the common doped region within the active regions 434 and/or 436. The silicide feature is formed by a process known in the art such as self-aligned silicide (salicide) and can be formed together with other contact silicide in the same processing procedure. In some embodiments, a contact is designed to land on both the drain of PD-11 and the source of PG-11. In some embodiments, the drain of PD-11 and the source of PG-11 share a common region. Similarly, the drain of PD-12 and the source of PG-12 are electrically connected in a way similar to the connection between the drain of PD-11 and the source of PG-11, such as by a silicide feature.

In some embodiments, as illustrated in FIG. 6, various contacts (illustrated as a rectangle with an "X") are formed on gates, source nodes, drain nodes, and various landing pads. In some examples, the contacts are designed as a square or rectangle in a top view.

In some embodiments, contacts are formed to connect the sources, drains, and/or gates of the devices of the two-port cell 104. For example, a gate of PU-11 is electrically connected to a drain of PU-12 through a contact 602, which is designed as a rectangle oriented in the y direction such that the contact 602 lands on both the gate structure 452 and the drain of the PU-12. Similarly, a gate of the PU-12 is electrically connected to a drain of the PU-11 through a contact 604, which is designed as a rectangle oriented in the y direction such that the contact 604 lands on both the gate structure 454 and the drain of the PU-11. In some examples, a contact 606 is designed as a rectangle oriented in the x direction such that the contact 606 lands on the drain of the PD-12, the drain of PU-12, and the source of PG-12, defining a storage node 214. In some examples, a contact 608 is designed as a rectangle oriented in the x direction such that the contact 608 lands on both the drain of the PD-11, the drain of PU-11, and the source of PG-12, defining a storage node 216 (also referred to as a storage node bar 216).

In some embodiments, contacts are formed to electrically connect devices of the two-port cell 104 to a power line Vdd. In some examples, a source of PU-11 is connected to a power line Vdd through a Vdd contact 610. Similarly, a source of PU-12 is connected to the power line Vdd through a Vdd contact 612.

In some embodiments, contacts are formed to electrically connect devices of the two-port cell 104 to a complementary power line Vss. For example, a source of PD-11 is connected to a complementary power line Vss through a Vss contact 614. For further example, a source of the RPD is connected to the complementary power line Vss through the Vss contact 614. For further example, a source of PD-12 is connected to a complementary power line Vss through a Vss contact 616.

In some embodiments, contacts are formed on gates of transistors to electrically connect transistors to word lines, including for example, a write word line and/or a read word line. For example, a gate of the PG-11 is connected to a write word line through a write word line contact 618, and a gate of the PG-12 is connected to the write word line through a write word line contact 620. For further example, a gate of the RPG 220 is connected to a read word line through a read word line contact 622.

In some embodiments, contacts are formed to electrically connect transistors to bit-lines, including for example, a write bit-line, a complementary write bit-line, and/or a read bit-line. For example, a drain of the PG-11 is connected to a write bit-line through a write bit-line contact 624. For further example, a drain of the PG-12 is connected to a complementary write bit-line through a write bit-line bar contact 626. For further example, a source of the RPG is connected to a read bit-line through a read bit-line contact 628.

Referring to FIG. 7, illustrated is a top view of the single-port cell 152 including interconnect routings. In various embodiments, various interconnect structures may be utilized to couple the nFinFETs and pFinFETs to form the functional single-port cell 152.

In some embodiments, nFinFETs and pFinFETs may be electrically connected in various ways. In some embodiments, the drain of PD-21 is electrically connected to the source of PG-21 by sharing a common doped region, a region defined in the active regions 534 and 536 and positioned between the PD-21 and PG-21. In some embodiments, the drain of PD-21 is electrically connected to the source of PG-21 by a silicide feature formed on the common doped region within the active regions 534 and/or 536. The silicide feature is formed by a process known in the art such as self-aligned silicide (salicide) and can be formed together with other contact silicide in a same processing procedure. In some embodiments, a contact is designed to land on both the drain of PD-21 and the source of PG-21. In some embodiments, the drain of PD-21 and the source of PG-21 share a common region. Similarly, the drain of PD-22 and the source of PG-22 are electrically connected in a way similar to the connection between the drain of PD-21 and the source of PG-21, such as by a silicide feature or a contact.

In some embodiments, the drains of PD-21 and PU-21 are electrically connected using a first interconnect feature, defining a first storage node. Similarly, the drains of PD-22 and PU-22 are electrically connected using a second interconnect feature, defining a second storage node (also referred to as storage node bar or data node bar). The first interconnect feature and the second interconnect feature are formed in a same interconnect layer by the same processing procedure. The first and second interconnect features may be a silicide feature.

In some embodiments, as shown in FIG. 7, various contacts (illustrated as a rectangle with an "X") are formed on gates, source nodes, drain nodes, and various landing pads of the single-port cell 152. The various contacts are designed as a square or rectangle in a top view.

In some embodiments, contacts are formed to connect the sources, drains, and/or gates of the transistors. For example, a gate of PU-21 is electrically connected to a drain of PU-22 through a contact 702, which is designed as a rectangle oriented in the y direction such that the contact 702 lands on both the gate structure 552 and the drain of the PU-22. Similarly, a gate of the PU-22 is electrically connected to a drain of the PU-21 through a contact 704, which is designed as a rectangle oriented in the y direction such that the contact 704 lands on both the gate structure 554 and the drain of the PU-21.

In some examples, a contact 706 is designed as a rectangle oriented in the x direction such that the contact 706 lands on the drain of the PD-22, the drain of PU-22, and the source of PG-22, defining a storage node 314. In some examples, a contact 708 is designed as a rectangle oriented in the x direction such that the contact 708 lands on both the drain of the PD-21, the drain of PU-21, and the source of PG-21, defining a storage node 316.

In some embodiments, contacts are formed to electrically connect transistors to a power line Vdd. In some examples, a source of PU-21 is connected to a power line Vdd through a Vdd contact 710. Similarly, a source of PU-22 is connected to the power line Vdd through a Vdd contact 712.

In some embodiments, contacts are formed to electrically connect transistors to a complementary power line Vss. For example, a source of PD-21 is connected to a complementary power line Vss through a Vss contact 714. For further example, a source of PD-22 is connected to a complementary power line Vss through a Vss contact 716.

In some embodiments, contacts are formed on gates of transistors to electrically connect transistors to a word line. For example, a gate of the PG-21 is connected to a word line through a word line contact 718, and a gate of the PG-22 is connected to the word line through a word line contact 720.

In some embodiments, contacts are formed to electrically connect transistors to bit-lines, including for example, a bit-line and/or a complementary bit-line (bit-line bar). For example, a drain of the PG-21 is connected to a write bit-line through a bit-line contact 724. For further example, a drain of the PG-22 is connected to a complementary bit-line through a bit-line bar contact 726.

It is noted that additional process steps may be implemented before, during, and after the method 350, and some process steps described above may be replaced or eliminated in accordance with various embodiments of the method 350.

Referring to FIGS. 8, 9A, 9B, 9C, 10, 11, 12, 13, 14, 15, and 16, a method 800 for forming a portion 480 of the integrated circuit 100 is described. As described above with reference to FIG. 4B, the portion 480 of the integrated circuit 100 includes a common gate structure 452 for devices PU-11, PD-11, and RPD, where a first portion 452A of the common gate structure 452 forms the gate of PU-11, a second portion 452B of the common gate structure 452 forms the gate of PD-11, and a third portion 452C of the common gate structure forms the gate of RPD. In various embodiments, the threshold voltages of PU-11, PD-11, and RPD are tuned by tuning the gate dielectric layer and/or work function layers of the common gate structure 452. The method 800 illustrates a method for forming a common gate structure for PU-11, PD-11, and RPD using a gate-last process.

Figure 8:
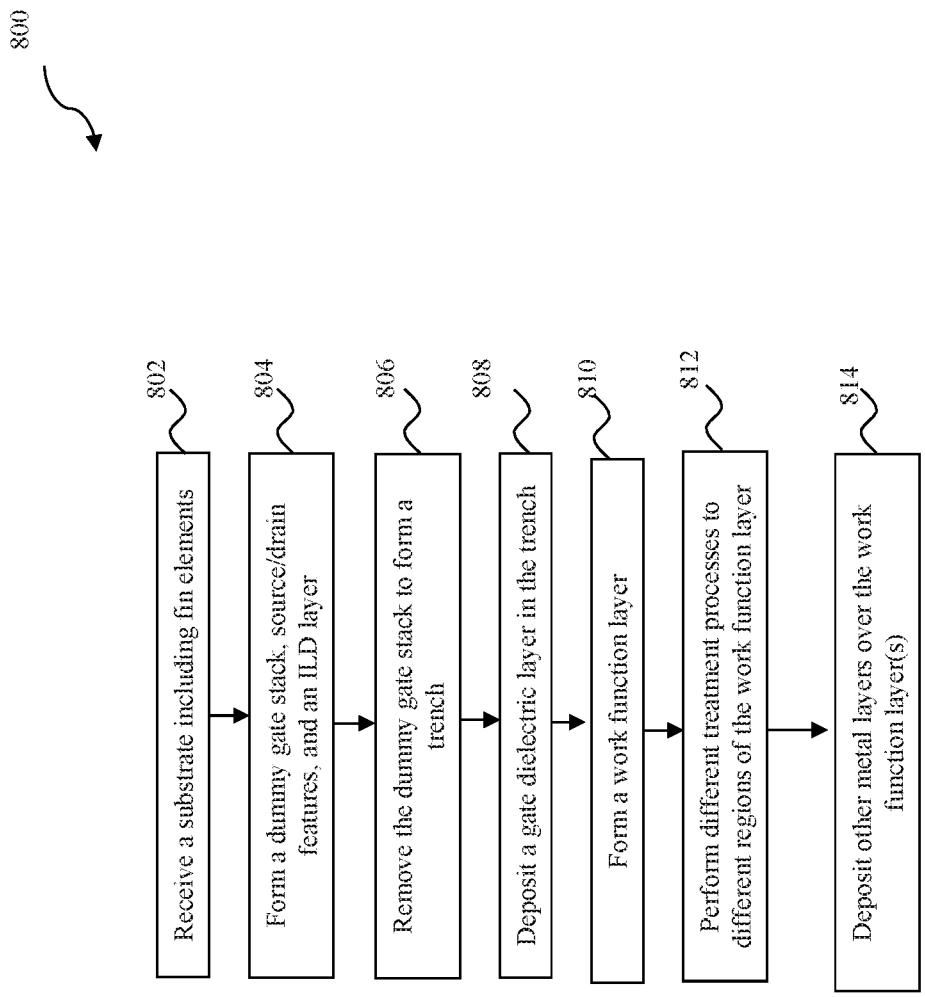
FIG. 8 is a flowchart of an embodiment of a method for making a portion of an integrated circuit according to various aspects of the present disclosure.
Figure 9A:
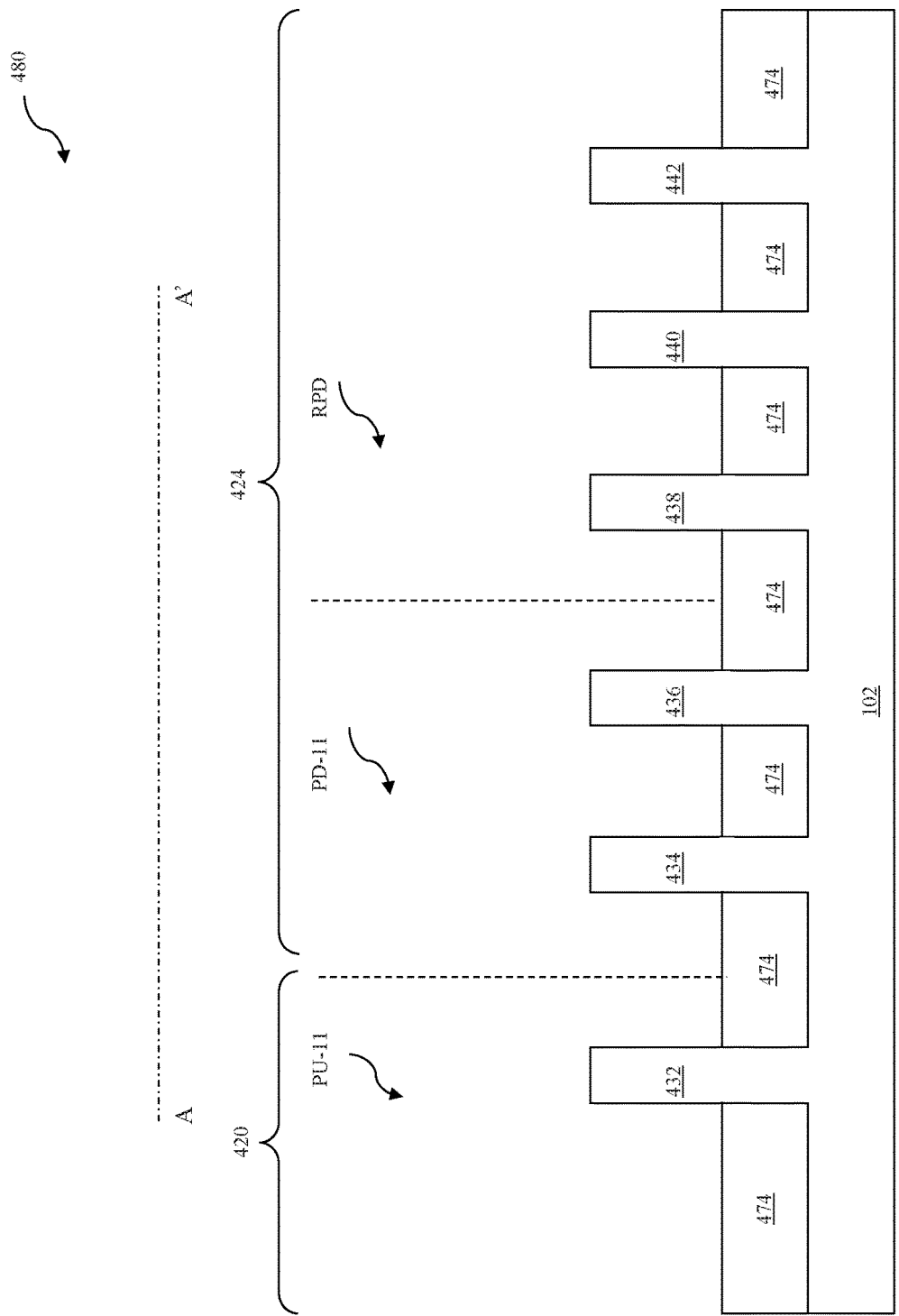
FIGS. 9A, 9B, 9C, 10, 11, 12, 13, 14, 15, and 16 are cross-sectional views of a portion of an integrated circuit according to various aspects of the present disclosure.

Referring to FIGS. 8 and 9A, the method 800 begins at block 802, where a substrate including fin elements are received. As illustrated in FIG. 9A, a portion 480 of the integrated circuit 100 includes a substrate 102. The substrate 102 may be a semiconductor substrate such as a silicon substrate. The substrate 102 may also include other semiconductors such as germanium (Ge), silicon carbide (SiC), silicon germanium (SiGe), or diamond. Alternatively, the substrate 102 may include a compound semiconductor and/or an alloy semiconductor. The substrate 102 may include various layers, including conductive or insulating layers formed on a semiconductor substrate. The substrate 102 may include various doping configurations depending on design requirements as is known in the art. For example, different doping profiles are formed on the substrate 102 in regions designed for different device types (e.g., n-well 420 for pFinFETs, p-well 424 for nFinFETs). The suitable doping may include ion implantation of dopants and/or diffusion processes. The substrate 102 includes isolation features 474 (e.g., shallow trench isolation (STI) features) interposing the regions providing different device types. Further, the substrate 102 may optionally include an epitaxial layer (epi-layer), may be strained for performance enhancement, may include a silicon-on-insulator (SOI) structure, and/or have other suitable enhancement features.

In the example of FIG. 9A, the substrate 102 includes fin elements 432, 434, 436, 438, 440, and 442. The fin elements may be fabricated using suitable processes including photolithography and etch processes. In an example, PU-11 will be formed on the fin element 432, PD-11 will be formed on the fin elements 434 and 436, and RPD will be formed on the fin elements 438, 440, and 442.

Figure 9B:
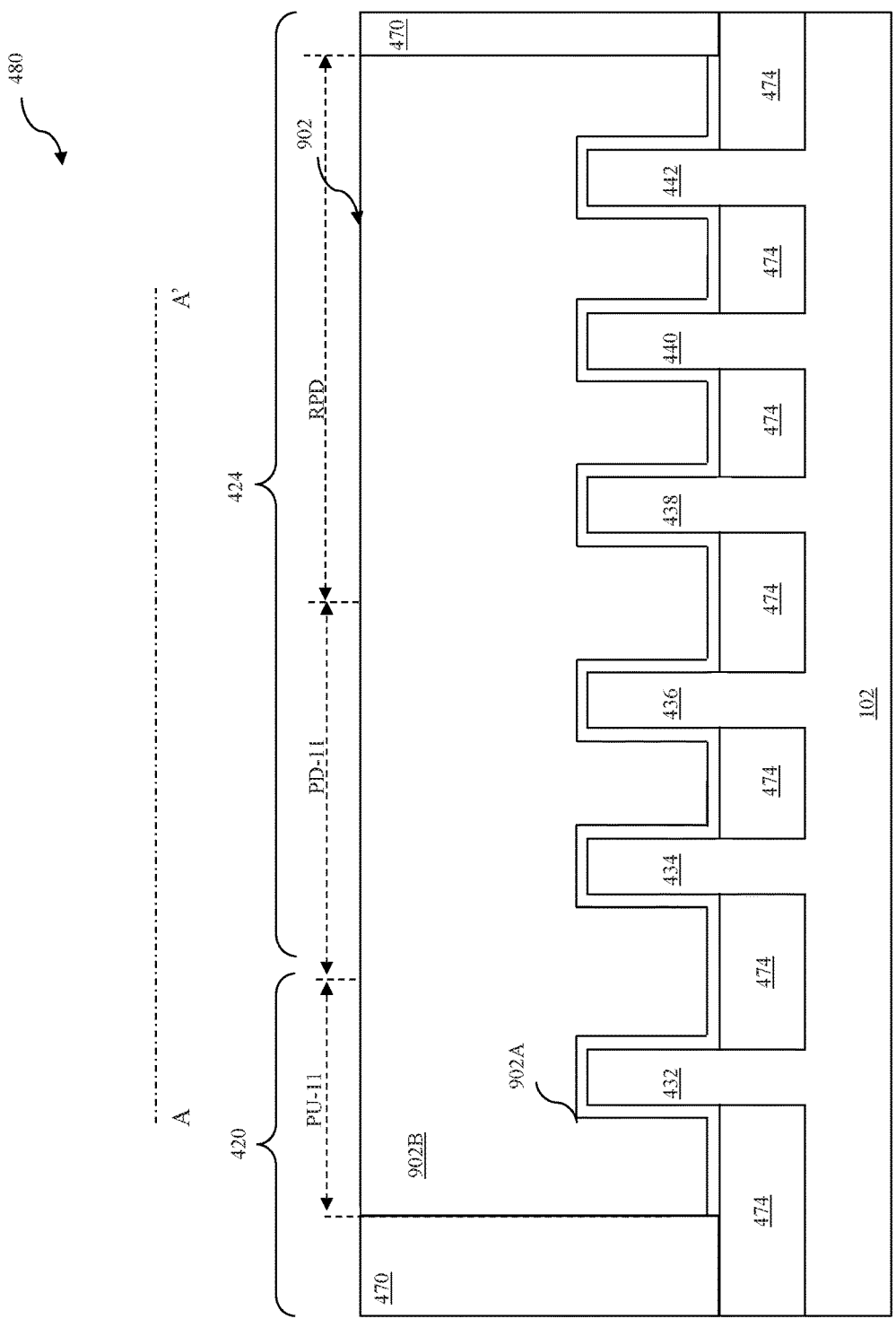

Referring to FIGS. 8 and 9B, the method 800 proceeds to block 804, where a dummy gate stack, source/drain features, and an ILD layer are formed over the substrate. In an embodiment, a dummy gate stack 902 is formed on the substrate 102. The dummy gate stack 902 may be replaced at a later processing stage by a high-k dielectric layer and metal gate electrode as discussed below. In some embodiments, the dummy gate stack 902 is formed over the substrate 102 and is at least partially disposed over the fin elements 432, 434, 436, 438, 440, and 442. The portion of the fin elements 432, 434, 436, 438, 440, and 442 underlying the dummy gate stack 902 may be referred to as the channel region of the fin elements. The dummy gate stack 902 may also define source/drain regions of the fin elements, for example, as the portion of the fin elements adjacent to and on opposing sides of the channel region.

In some embodiments, the dummy gate stack 902 may include a capping layer 902A and a dummy gate electrode layer 902B. In some embodiments, the capping layer may include $SiO_2$, silicon nitride, a high-k dielectric material or other suitable material. In various examples, the capping layer may be deposited by a CVD process, a subatmospheric CVD (SACVD) process, a flowable CVD process, an ALD process, a PVD process, or other suitable process. By way of example, the capping layer 902A may be used to prevent damage to the fin elements by subsequent processing (e.g., subsequent formation of the dummy gate stack). In some embodiments, the dummy gate stack 902 may include a dummy gate electrode layer 902B formed over the capping layer on the fin elements. In some examples, the dummy gate electrode layer 902B may include polycrystalline silicon (polysilicon).

In some embodiments, the dummy gate stack 902 may be formed by various process steps such as layer deposition, patterning, etching, as well as other suitable processing steps. Exemplary layer deposition processes includes CVD (including both low-pressure CVD and plasma-enhanced CVD), PVD, ALD, thermal oxidation, e-beam evaporation, or other suitable deposition techniques, or combinations thereof. In forming the dummy gate stack 902 for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods.

In some embodiments, a gate spacer may be formed on sidewalls of the dummy gate stack 902. The gate spacer may include one or more dielectric materials such as silicon nitride, silicon oxide, silicon carbide, silicon oxycarbide (SiOC), silicon oxycarbon nitride (SiOCN), other materials, or a combination thereof. The spacer layer may include a single layer or a multi-layer structure. The spacer layer may be formed by chemical oxidation, thermal oxidation, ALD, CVD, and/or other suitable methods.

In some embodiments, after the dummy gate stack 902 is formed in the channel region, source/drain features are formed in the source/drain region of the fin elements 432, 434, 436, 438, 440, and 442. The source/drawn features may be formed adjacent to and associated with the dummy gate stack 902 by performing an epitaxial growth process that provides an epitaxy material cladding to the fin elements' source/drain regions. In various embodiments, the source/drain features may include Ge, Si, GaAs, AlGaAs, SiGe, GaAsP, SiP, or other suitable material. In some embodiments, source/drain features may be in-situ doped during the epi process. In some embodiments, the source/drain features are not in-situ doped, and instead an implantation process is performed to dope the source/drain features.

In some embodiments, an inter-layer dielectric (ILD) layer 470 is formed over the substrate. In some embodiments, the ILD layer 470 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 470 may be formed by a PECVD process, a flowable CVD (FCVD) process, or other suitable deposition technique. In some embodiments, a planarization process, such as a chemical mechanical planarization (CMP) process, may be performed the ILD layer 470 to expose a top surface of the dummy gate stack 902.

Figure 9C:
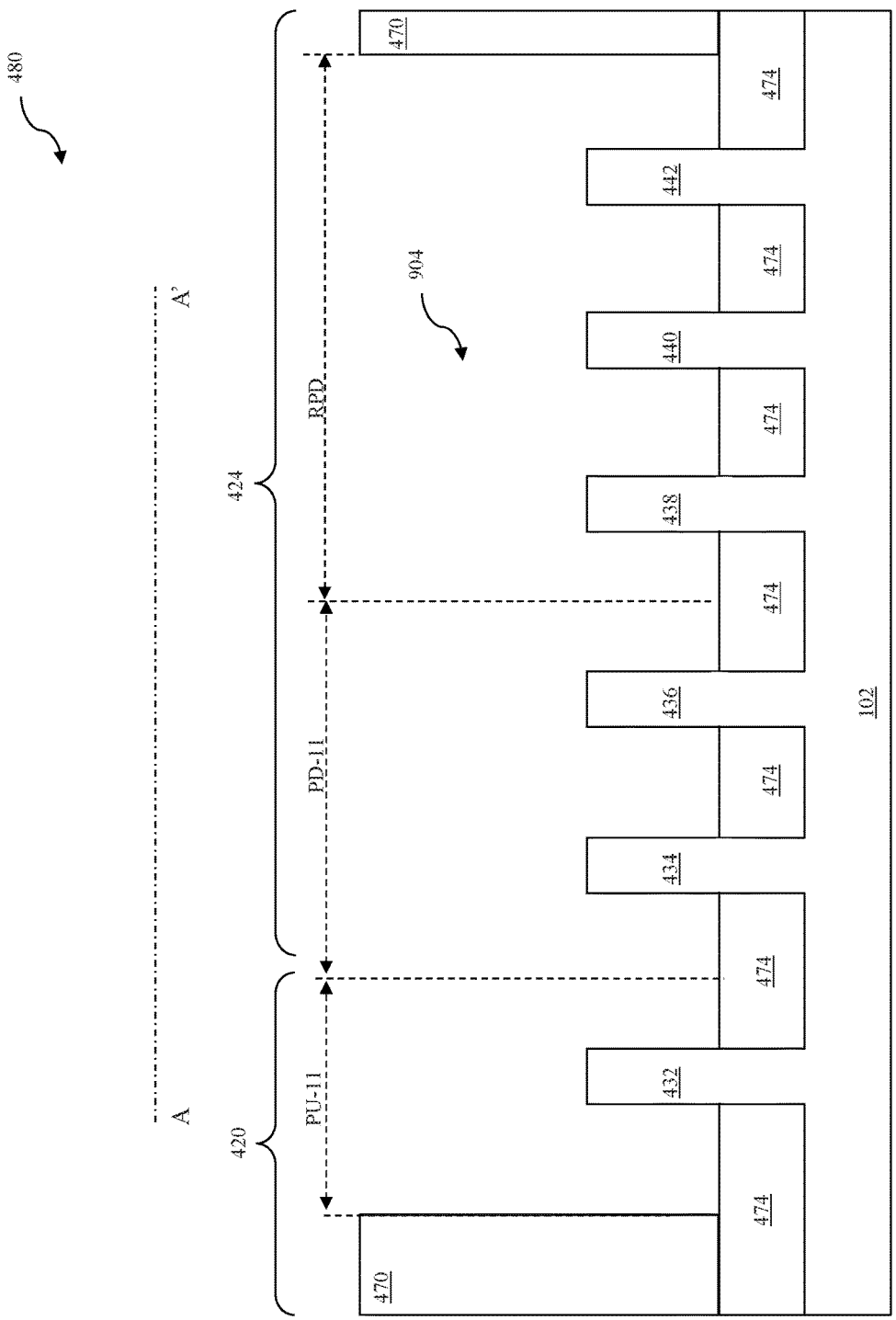

Referring to FIGS. 8 and 9C, the method 800 proceeds to block 806, where the dummy gate stack is removed to form a trench. Referring to FIG. 9C, the removal of the dummy gate stack 902 forms an opening 904 that exposes the channel regions of the fin elements 432, 434, 436, 438, 440, and 442. In an embodiment, block 806 includes one or more etching processes, such as wet etching, dry etching, or other etching techniques.

Figure 10:
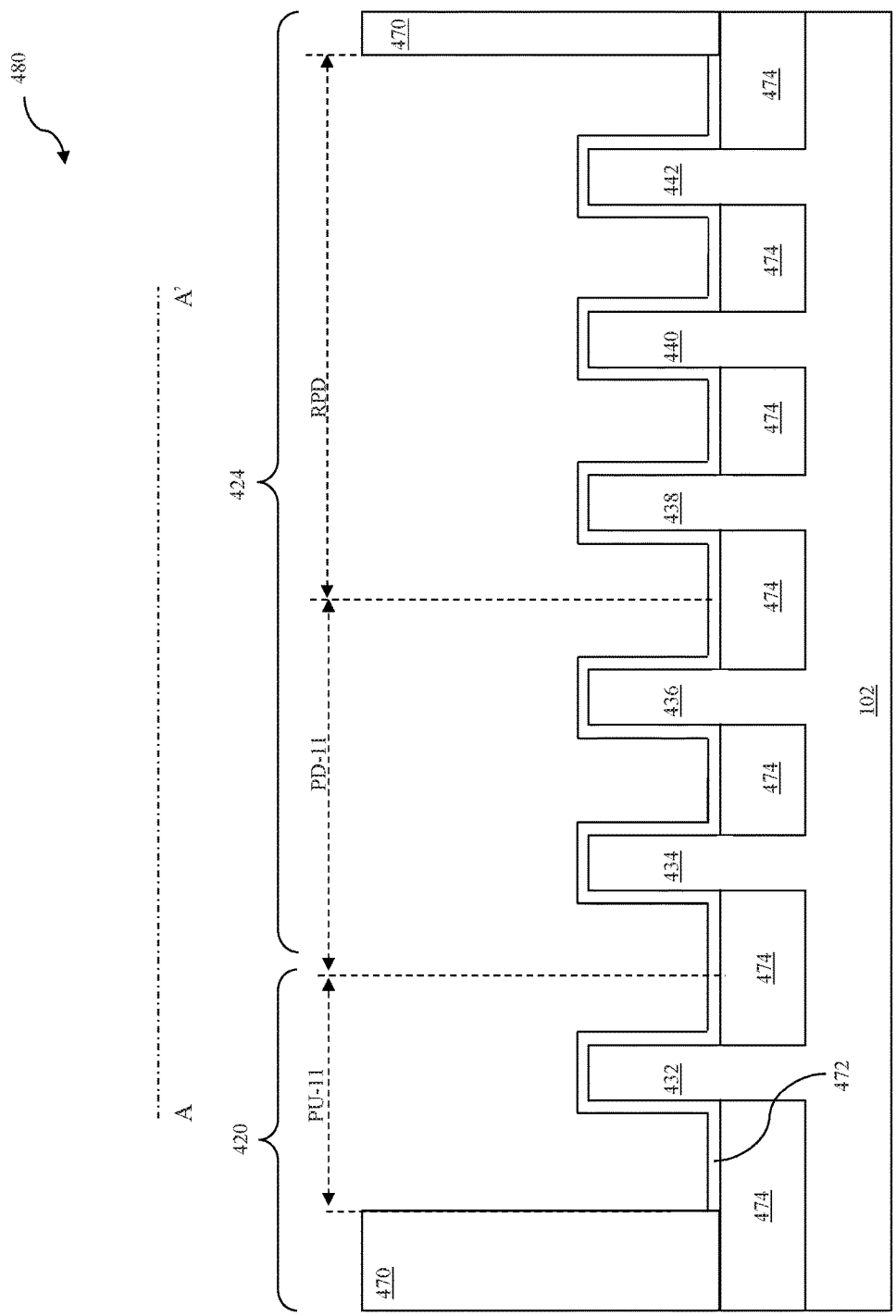

Referring to FIGS. 8 and 10, the method 800 proceeds to block 808, where a gate dielectric layer is formed in the trench by depositing a high-k dielectric material. In some embodiments, the high-k dielectric material has a high dielectric constant, for example, greater than that of thermal silicon oxide (~3.9). The high-k dielectric material may include hafnium oxide ($HfO_2$), zirconium oxide ($ZrO_2$), lanthanum oxide ($La_2O_3$), aluminum oxide ($Al_2O_3$), titanium oxide ($TiO_2$), yttrium oxide, strontium titanate, hafnium oxynitride ($HfO_xN_y$), other suitable metal-oxides, or combinations thereof. The high-k dielectric layer 472 may be formed by ALD, chemical vapor deposition (CVD), physical vapor deposition (PVD), remote plasma CVD (RPCVD), plasma enhanced CVD (PECVD), metal organic CVD (MOCVD), sputtering, other suitable processes, or combinations thereof.

Figure 11:
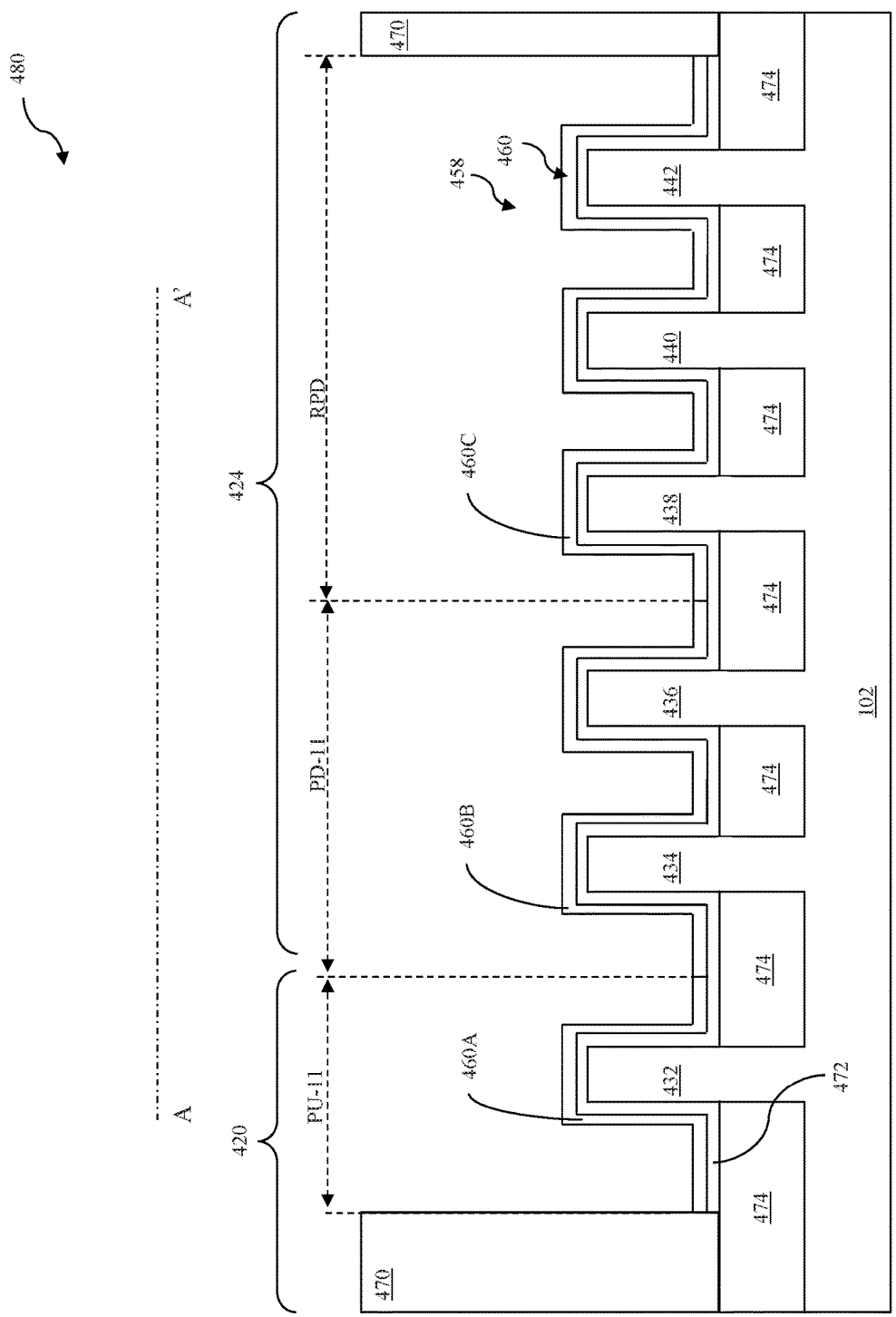
Figure 12:
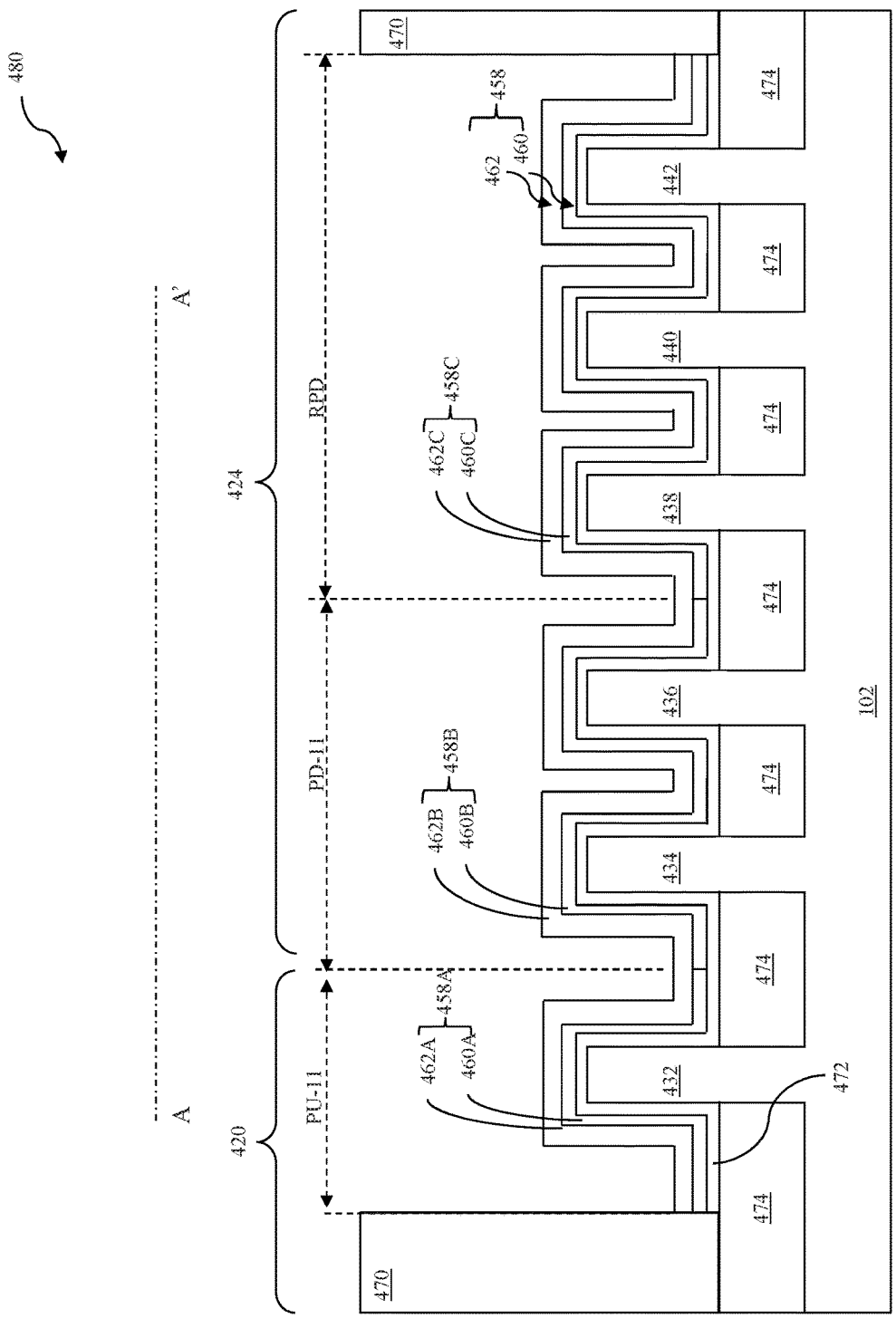

Referring to FIGS. 8, 11, and 12, the method 800 proceeds to block 810, where a work function layer is formed over the gate dielectric layer. The work function layer 458 may include one or more work function sub-layers. Referring to the example of FIG. 11, a first work function sub-layer 460 is formed over the gate dielectric layer 427. In some embodiments, the first work function sub-layer 460 includes the same material (e.g., TaN) for devices PU-11, PD-11, and RPD, and may be formed by CVD, PVD, plating, and/or other suitable processes.

In some embodiments, as discussed above with reference to FIG. 4B, the first work function sub-layer 460 in different regions may include different materials for tuning the threshold voltages of the respective devices. In such embodiments, portions 460A, 460B, and 460C of the first work function sub-layer 460 may include different materials, and be formed separately. In an example, to form a particular portion (e.g., 460B) of the first work function sub-layer 460 for a particular device (e.g., PD-11) a protection layer is deposited over the regions for the other devices (e.g., PU-11 and RPD), while the region for that particular device (e.g., PD-11) remains exposed. The protection layer may include a photoresist material, and may be formed by a lithography process over the substrate 102. The particular portion (e.g., 460B) of the first work function sub-layer 460 may be formed in the exposed region (e.g., by CVD, PVD, plating, and/or other suitable processes). After forming the particular portion 460A of the first work function sub-layer 460, the protective layer over the regions for the other devices is removed (e.g., by an etch process). These steps may be repeated for different portions of the work function sub-layer 460, so that portions 460A, 460B, and 460C may include materials selected to achieve the proper work functions for the respective devices PU-11, PD-11, and RPD.

Referring to the example of FIG. 12, a second work function sub-layer 462 is formed over the first work-function sub-layer 460. In some embodiments, different portions 462A, 462B, and 462C of the second work function sub-layer 462 include different materials, and are formed separately using steps substantially similar to the steps forming the portions 460A, 460B, and 460C of the first work function sub-layer 460 as described above with reference to FIG. 11.

In some embodiments, at block 810, the second work function sub-layer 460 includes the same material (e.g., Ti) for devices PU-11, PD-11, and RPD, and may be formed by CVD, PVD, plating, and/or other suitable processes. In such embodiments, as discussed in detail below with reference to FIGS. 8, 13, 14, and 15, subsequent treatment processes may be performed to different regions of the second work function sub-layer 460 to achieve proper work functions for the corresponding devices PU-11, PD-11, and RPD.

Figure 13:
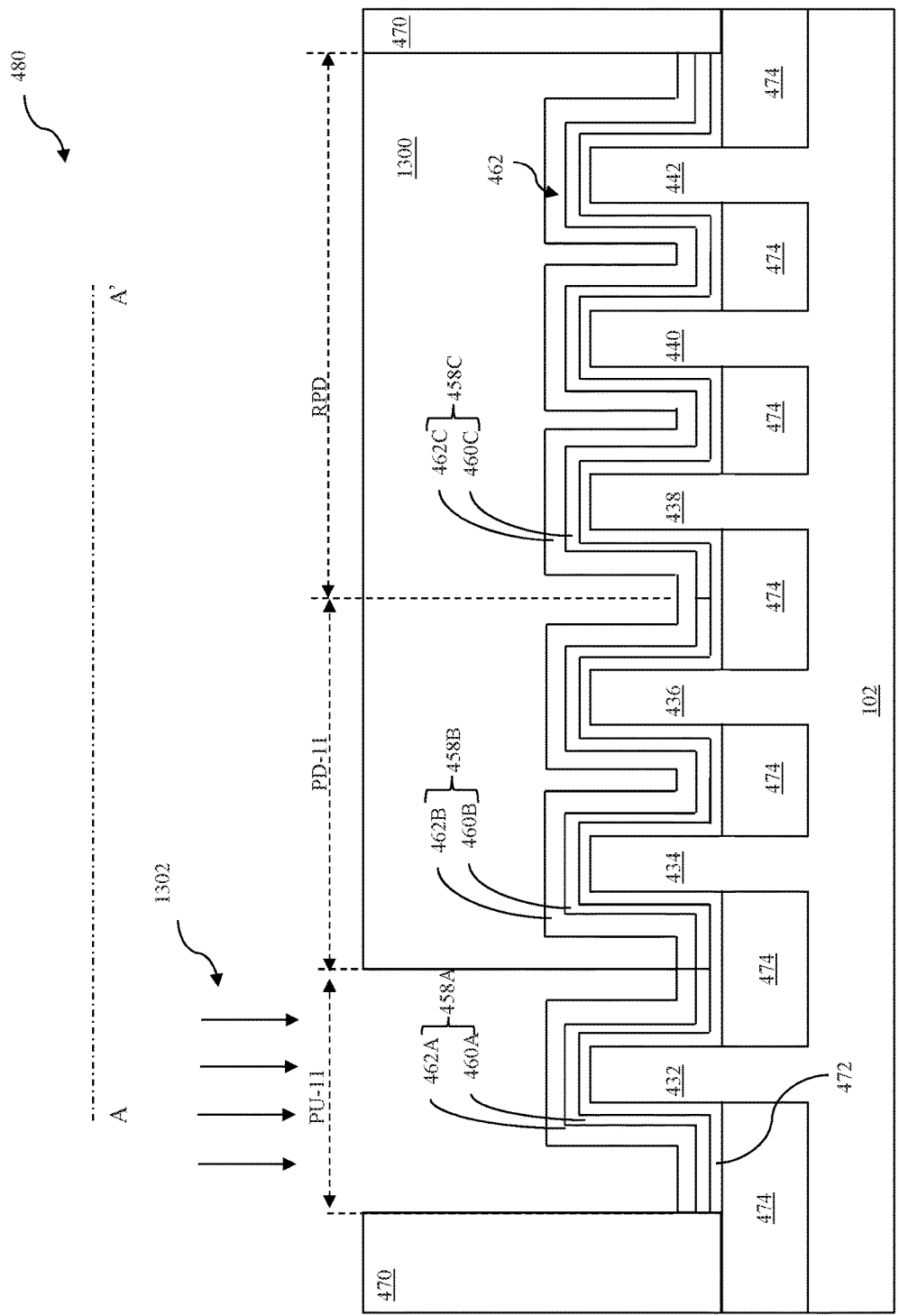

Referring to FIGS. 8, 13, 14, and 15, the method 800 proceeds to block 812, where various treatment processes may be performed to different regions of the work function layer. Referring to FIG. 13, in some examples, a treatment process may be performed to a region for a particular device. A protective layer 1300 is formed over the regions of PD-11 and RPD using a lithography process to protect portions 458B and 458C of the work function layer 458. A treatment process 1302 may be performed to the portion 458A of the work function layer 458. The treatment process 1302 may include an ion implantation process implanting ions to the portion 458A. In an example, the ion implantation process implants nitrogen ions to the portion 458A including Ti. The dopant concentration in the portion 458A is controlled (e.g., by controlling dopant species, ion beam energy, implantation dose of the implantation process 1302) so as to result in a desired work function of the implanted portion 458A. In some embodiments, the steps may be repeated to perform treatment processes (e.g., an ion implantation process) to regions for PD-11 and RPD separately.

Figure 14:
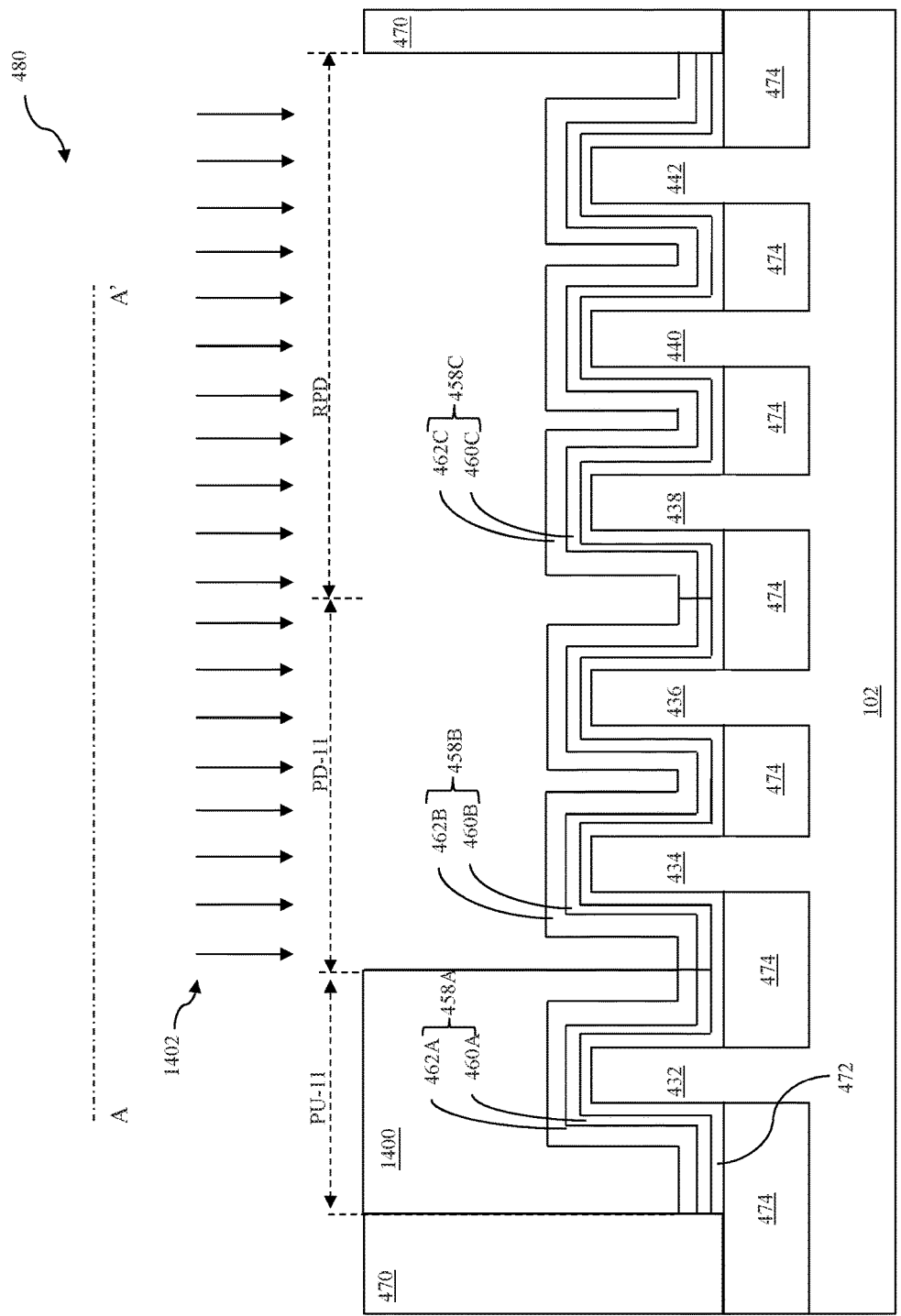
Figure 15:
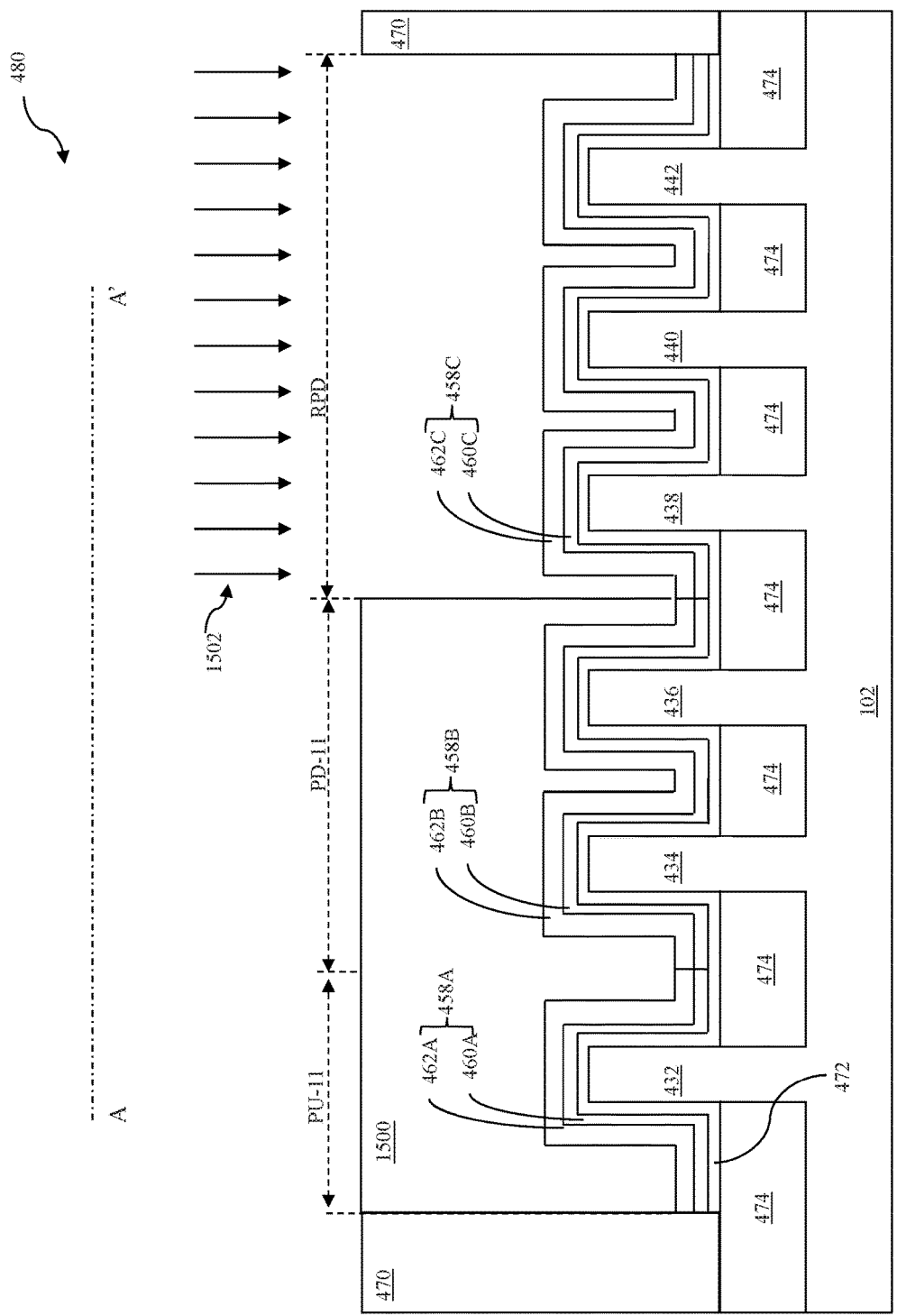

Referring to FIGS. 14 and 15, in some embodiments, the portions 458B and 458C may be designed to have different dopant concentrations of the same dopant. In such embodiments, a first treatment process may be performed to both portions 458B and 458C, followed by a second treatment process performed to only the portion (e.g., the portion 458c) designed to have a higher dopant concentration. As such, Referring to the example of FIG. 14, a protective layer 1400 is formed over the region for PU-11, protecting the work function layer portion 458A. A first treatment process 1402 is performed to the portions 458B and 458C of the work function layer 458. The first treatment process 1402 may include an ion implantation process implanting ions to the portions 458B and 458C. In an example, the first ion implantation process 1402 implants aluminum ions to the portions 458B and 458C including Ti. At this stage, the dopant concentration in the portions 458B and 458C is controlled (e.g., by controlling dopant species, ion beam energy, implantation dose of the implantation process 1402) so as to result in a desired work function of the implanted portion 458B.

Referring to the example of FIG. 15, after performing the first treatment process 1402, a protective layer 1500 is formed over the regions for PU-11 and PD-11, protecting the work function layer portion 458A and 458B. A second treatment process 1502 is performed to the portion 458C of the work function layer 458. The second treatment process 1502 may include an ion implantation process implanting ions to the portion 458C. In an example, the second ion implantation process 1502 implants aluminum ions to the portion 458C including Ti. The dopant concentration in the portion 458C is controlled (e.g., by controlling dopant species, ion beam energy, implantation dose of the implantation process 1502) so as to result in a desired work function of the implanted portion 458C. After the second implantation process 1502 is completed, the protection layer 1500 is removed. In alternative embodiments, instead of the ion implantation processes, the various work function layers are patterned such that each portion has desired work functions. In some embodiments, the ion implantation process and patterning process are collectively performed in a procedure define different regions with respective work functions.

Figure 16:
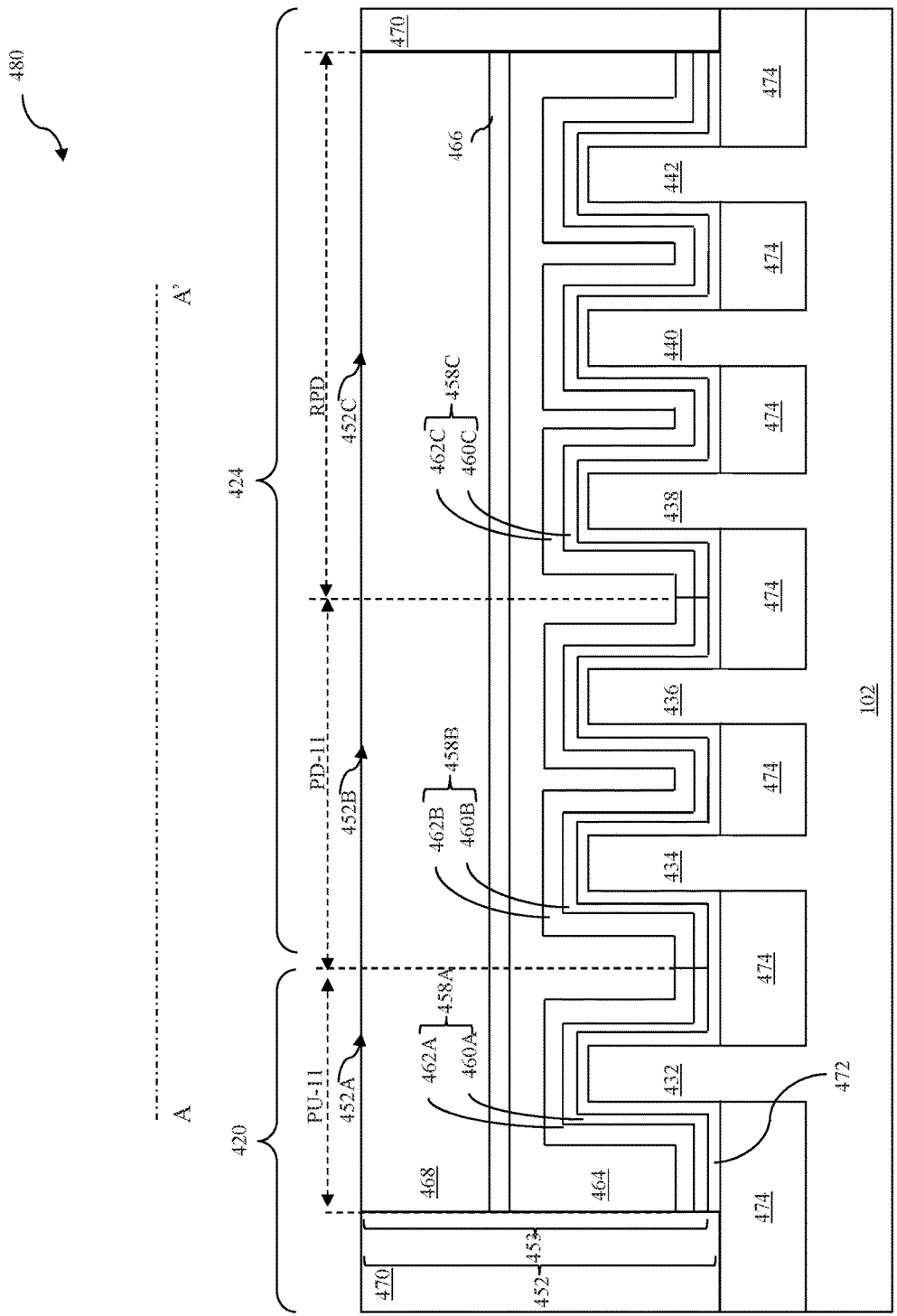

Referring to FIGS. 8 and 16, the method 800 proceeds to block 814, where other metal layers are formed over the work function layer(s) to form the common gate structure 452. Referring to FIG. 16, various metal layers are formed over the work function layer 458. In some embodiments, a metal layer 464 is formed over the work function layer 458. In some embodiments, a barrier metal layer 466 is formed over the metal layer 464. In some embodiments, a fill metal layer 468 is formed over the barrier layer 466. Each of the metal layers may be formed by CVD, PVD, plating, and/or other suitable processes.

The embodiments of the present disclosure offer advantages over existing art, although it is understood that different embodiments may offer different advantages, not all advantages are necessarily discussed herein, and that no particular advantage is required for all embodiments. One of the advantages of some embodiments is that an integrated circuit includes a first SRAM array with an ultra-low operation voltage Vcc_min, and a second SRAM array with low standby power consumption. In an example, the first SRAM array includes two-port cells, where each two-port cell includes a write port and a read port. Devices in each two-port cell may have different threshold voltages. For example, the read-port devices (e.g., read pull-down device and/or read pass-gate device) and pull-up devices of the write-port devices may have threshold voltages lower than that of the pull-down devices and/or pass-gate devices of the write-port devices. Such configuration may improve the stability of the two-port cell operating under a low operation voltage. Another advantage of some embodiments is that the two-port cell includes a write-assist circuitry electrically connected to a write word-line of the two-port cell, which enhances the write capability of the two-port cell. Yet another advantage of some embodiments is that the second SRAM array includes single-port cells having devices with threshold voltages higher than those of the devices of the two-port cells, which help to lower standby power consumption of the second SRAM array. Yet another advantage of some embodiments is that by tuning work function layers to meet the different threshold voltage requirements for different devices, a wide threshold voltage tuning range may be achieved without mismatch degradation and increased junction leakage.

Thus, in an embodiment provided is an integrated circuit formed in a semiconductor substrate including a first static random access memory (SRAM) cell and a second SRAM cell. The first SRAM cell includes first and second pull-up devices, first and second pull-down devices configured with the first and second pull-up devices to form first and second cross-coupled inverters for data storage, first and second pass-gate devices configured with the first and second cross-coupled inverters for writing data; a read pull-down device coupled to the first inverter; and a read pass-gate device coupled to the read pull-down device for reading data. The second SRAM cell includes third and fourth pull-up devices, third and fourth pull-down devices configured with the third and fourth pull-up devices to form third and fourth cross-coupled inverters for data storage, third and fourth pass-gate devices configured with the two cross-coupled inverters for data access. A gate of the first pull-up device includes a first work function layer having a first work function. A gate of the first pull-down device includes a second work function layer having a second work function different from the first work function. A gate of the third pull-up device includes a third work function layer having a third work function different from the first and second work functions.

In another embodiment, an integrated circuit includes a first static random access memory (SRAM) cell and a second SRAM cell. The first SRAM cell includes a write port portion and a read port portion. The write port portion includes first and second pull-up devices, and first and second pull-down devices configured with the first and second pull-up devices to form first and second cross-coupled inverters for data storage. The second SRAM cell includes third and fourth pull-up devices, and third and fourth pull-down devices configured with the third and fourth pull-up devices to form third and fourth cross-coupled inverters for data storage. A gate of the first pull-up device includes a work function layer including a first work function material. A gate of the first pull-up device includes a first work function layer having a first work function. A gate of the first pull-down device includes a second work function layer having a second work function different from the first work function. A gate of the third pull-up device includes a third work function layer having a third work function different from the first and second work functions. A gate of the third pull-down device includes a fourth work function layer including a fourth work function different from the first, second, and third work functions.

In another embodiment, an integrated circuit includes a first SRAM array including a plurality of two-port SRAM cells. Each two-port SRAM cell includes a write port portion and a read port portion. The write port portion includes first and second pull-up devices, and first and second pull-down devices configured with the first and second pull-up devices to form first and second cross-coupled inverters for data storage. The read port portion includes a read pull-down device coupled to the first inverter. The integrated circuit includes a second SRAM array including a plurality of single-port SRAM cells. Each single-port SRAM cell includes third and fourth pull-up devices, and third and fourth pull-down devices configured with the third and fourth pull-up devices to form third and fourth cross-coupled inverters for data storage. The first pull-up device includes a first work function layer having a first work function. The first pull-down device includes a second work function layer having a second work function different from the first work function. The read pull-down device includes a third work function layer having a third work function different from the first and second work functions. The third pull-up device includes a fourth work function layer having a fourth work function different from the first, second, and third work functions. The third pull-down device includes a fifth work function layer having a fifth work function different from the first, second, third, and fourth work functions.

The first pull-up device includes a work function layer including a first work function material. The first pull-down device includes a work function layer including a second work function material. The read pull-down device includes a work function layer including a third work function material. The third pull-up device includes a work function layer including a fourth work function material. The third pull-down device includes work function layer including a fifth work function material.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit, comprising:
    a first static random access memory (SRAM) cell in a semiconductor substrate, wherein the first SRAM cell includes:
        first and second pull-up devices;
        first and second pull-down devices configured with the first and second pull-up devices to form first and second cross-coupled inverters for data storage;
        first and second pass-gate devices configured with the first and second cross-coupled inverters for writing data;
        a read pull-down device coupled to the first inverter; and
        a read pass-gate device coupled to the read pull-down device for reading data;
    a second SRAM cell in the semiconductor substrate, wherein the second SRAM cell includes:
        third and fourth pull-up devices;
        third and fourth pull-down devices configured with the third and fourth pull-up devices to form third and fourth cross-coupled inverters for data storage;
        third and fourth pass-gate devices configured with the two cross-coupled inverters for data access;
        wherein a gate of the first pull-up device includes a first work function layer having a first work function;
        wherein a gate of the first pull-down device includes a second work function layer having a second work function different from the first work function; and
        wherein a gate of the third pull-up device includes a third work function layer having a third work function different from the first and second work functions.

2. The integrated circuit of claim 1, where a gate of the third pull-down device includes a work function layer having the second work function.

3. The integrated circuit of claim 1, wherein the first SRAM cell includes a contiguous gate structure including the gate of the first pull-up device, the gate of the first pull-down device, and a gate of the read pull-down device; and
    wherein the gate of the read pull-down device includes a fourth work function layer including a fourth work function different from the first, second, and third work functions.

4. The integrated circuit of claim 3, wherein a gate of the third pull-down device includes a fifth work function layer having a fifth work-function different from the first, second, third, and fourth work functions.

5. The integrated circuit of claim 3, wherein the first pull-down device has a first pull-down device threshold voltage, wherein the read pull-down device has a read pull-down device threshold voltage, and wherein the first pull-down device threshold voltage is greater than the read pull-down device threshold voltage by at least about 40 millivolts (mV).

6. The integrated circuit of claim 1, wherein the gate of the first pull-up device includes a first high-k dielectric material, and wherein the gate of the third pull-up device includes a second high-k dielectric material substantially the same as the first high-k dielectric material.

7. The integrated circuit of claim 1, wherein the first, second, third, and fourth pull-up devices are p-type fin-like field-effect transistors (pFinFETs), and wherein the first, second, third, and fourth pull-down devices, the first, second, third, and fourth pass-gate devices, the read pass-gate device, and the read pull-down device are n-type FinFETs (nFinFETs).

8. The integrated circuit of claim 1, wherein the first SRAM cell includes a write assist circuitry including a word-line voltage boost generator electrically connected to the first and second pass-gate devices.

9. The integrated circuit of claim 1, wherein the first pull-up device has a first pull-up device threshold voltage, wherein the third pull-up device has a third pull-up device threshold voltage, and wherein the third pull-up device threshold voltage is greater than the first pull-up device threshold voltage by at least about 40 mV.

10. An integrated circuit, comprising:

a first static random access memory (SRAM) cell in a semiconductor substrate, wherein the first SRAM cell includes a write port portion and a read port portion, wherein the write port portion includes:
    first and second pull-up devices; and
    first and second pull-down devices configured with the first and second pull-up devices to form first and second cross-coupled inverters for data storage;
a second SRAM cell in the semiconductor substrate, wherein the second SRAM cell includes:
    third and fourth pull-up devices; and
    third and fourth pull-down devices configured with the third and fourth pull-up devices to form third and fourth cross-coupled inverters for data storage;
wherein a gate of the first pull-up device includes a first work function layer having a first work function;
wherein a gate of the first pull-down device includes a second work function layer having a second work function different from the first work function;
wherein a gate of the third pull-up device includes a third work function layer having a third work function different from the first and second work functions; and
wherein a gate of the third pull-down device includes a fourth work function layer having a fourth work function different from the first, second, and third work functions.

11. The integrated circuit of claim 10, wherein the first work function layer includes a plurality of work function sub-layers.

12. The integrated circuit of claim 11, wherein the gate of the first pull-up device includes a first high-k dielectric material, and wherein the gate of the third pull-up device includes a second high-k dielectric material approximately the same as the first high-k dielectric material.

13. The integrated circuit of claim 11, wherein the first, second, third, and fourth pull-up devices are p-type fin-like field-effect transistors (pFinFETs), and wherein the first, second, third, and fourth pull-down device are n-type FinFETs (nFinFETs).

14. The integrated circuit of claim 11, wherein the write port portion of the first SRAM cell includes:

first and second pass-gate devices first and second pass-gate devices coupled with the first and second cross-coupled inverters; and a write assist circuitry including a word-line voltage boost generator electrically connected to the first and second pass-gate devices.

15. The integrated circuit of claim 11, wherein the first pull-up device has a first pull-up device threshold voltage, wherein the third pull-up device has a third pull-up device threshold voltage, and wherein the third pull-up device threshold voltage is greater than the first pull-up device threshold voltage by at least about 40 mV.

16. The integrated circuit of claim 11, wherein the first pull-down device has a first pull-down device threshold voltage, wherein the third pull-down device has a third pull-down device threshold voltage, and wherein the third pull-down device threshold voltage is greater than the first pull-down device threshold voltage by at least about 40 mV.

17. An integrated circuit, including:

a first SRAM array in a semiconductor substrate, wherein the first SRAM array includes a plurality of two-port SRAM cells, wherein each two-port SRAM cell includes a write port portion and a read port portion, wherein the write port portion includes:
    first and second pull-up devices;
    first and second pull-down devices configured with the first and second pull-up devices to form first and second cross-coupled inverters for data storage;
wherein the read port portion includes a read pull-down device coupled to the first inverter;
a second SRAM array in the semiconductor substrate, wherein the second SRAM array includes a plurality of single-port SRAM cells, wherein each single-port SRAM cell includes:
    third and fourth pull-up devices;
    third and fourth pull-down devices configured with the third and fourth pull-up devices to form third and fourth cross-coupled inverters for data storage;
wherein the first pull-up device includes a first work function layer having a first work function;
wherein the first pull-down device includes a second work function layer having a second work function different from the first work function,
wherein the read pull-down device includes a third work function layer having a third work function different from the first and second work functions,
wherein the third pull-up device includes a fourth work function layer having a fourth work function different from the first, second, and third work functions; and
wherein the third pull-down device includes a fifth work function layer having a fifth work function different from the first, second, third, and fourth work functions.

18. The integrated circuit of claim 17, wherein each two-port SRAM cell includes a write-assist circuit including a word-line voltage boost generators electrically connected to a write word line of the two-port SRAM cell.

19. The integrated circuit of claim 18, wherein the write-assist circuit is configured to provide a write word line voltage higher than a power supply voltage provided to the two-port SRAM cell by at least about 30 mV.

20. The integrated circuit of claim 17, wherein the first pull-up device has a first threshold voltage, and
   wherein the third pull-up device has a second threshold voltage greater than the first threshold voltage by at least about 40 mV.

\* \* \* \* \*